(12) United States Patent
Hoya

(10) Patent No.: US 8,101,684 B2
(45) Date of Patent: Jan. 24, 2012

(54) THERMOPLASTIC RESIN COMPOSITION FOR SEALING SOLAR CELL, SHEET FOR SEALING SOLAR CELL AND SOLAR CELL

(75) Inventor: Hiroshi Hoya, Chiba (JP)

(73) Assignee: Mitsui Chemicals, Inc., Tokyo (JP)

( * ) Notice: Subject to any disclaimer, the term of this patent is extended or adjusted under 35 U.S.C. 154(b) by 153 days.

(21) Appl. No.: 12/309,602

(22) PCT Filed: Jul. 27, 2007

(86) PCT No.: PCT/JP2007/064808
§ 371 (c)(1),
(2), (4) Date: Jan. 23, 2009

(87) PCT Pub. No.: WO2008/015984
PCT Pub. Date: Feb. 7, 2008

(65) Prior Publication Data
US 2010/0000600 A1    Jan. 7, 2010

(30) Foreign Application Priority Data

Jul. 31, 2006  (JP) ................. 2006-209266

(51) Int. Cl.
*C08F 8/00* (2006.01)
*C08F 210/14* (2006.01)
*C08F 10/14* (2006.01)
*C08F 110/14* (2006.01)
*C08F 110/06* (2006.01)
*C08L 23/00* (2006.01)

(52) U.S. Cl. ..... 525/191; 525/240; 526/348; 526/348.2; 526/348.6; 526/351

(58) Field of Classification Search ............... 525/191, 525/240; 526/348, 348.2, 348.3, 348.6, 351
See application file for complete search history.

(56) References Cited

U.S. PATENT DOCUMENTS

| | | | |
|---|---|---|---|
| 6,632,885 B2 * | 10/2003 | Morizono et al. | 525/191 |
| 7,488,789 B2 * | 2/2009 | Ikenaga et al. | 526/348.6 |
| 2006/0057321 A1 | 3/2006 | Mori et al. | |
| 2007/0251572 A1 | 11/2007 | Hoya et al. | |
| 2008/0220193 A1 | 9/2008 | Tohi et al. | |
| 2010/0056691 A1 * | 3/2010 | Hoya | 524/424 |
| 2010/0093941 A1 * | 4/2010 | Akai et al. | 525/240 |
| 2010/0285325 A1 * | 11/2010 | Hoya | 428/516 |

FOREIGN PATENT DOCUMENTS

| | | |
|---|---|---|
| JP | 2000-091611 A | 3/2000 |
| JP | 2002-97325 A | 4/2002 |
| JP | 2003-147135 A | 5/2003 |
| JP | 2004-210943 A | 7/2004 |
| JP | 2004-285318 A | 10/2004 |
| JP | 2006-176600 A | 7/2006 |
| JP | 2006-210905 A | 8/2006 |
| WO | WO 2006/057361 A1 | 6/2006 |
| WO | WO 2006/070793 A1 | 7/2006 |
| WO | WO 2006/123759 A1 | 11/2006 |
| WO | WO 2007/061030 A1 | 5/2007 |

* cited by examiner

*Primary Examiner* — Nathan M Nutter
(74) *Attorney, Agent, or Firm* — Foley & Lardner LLP

(57) ABSTRACT

A material which is excellent in mechanical strength, solar cell sealing properties, transparency, etc., even in an uncrosslinked state and is used in producing a sheet for solar cell sealing. The thermoplastic resin composition for solar cell sealing comprises (A) 0-70 wt. % propylene polymer having a melting point of 100° C. or higher and (B) 30-100 wt. % propylene copolymer satisfying the following requirements (b). (b) The copolymer has an MFR (230° C., 2.16-kg load) in the range of 0.01-100 g/10 min and satisfies at least one of the following requirements (b-1) and (b-2): (b-1) the rr content is 60% or higher; and (b-2) the copolymer comprises 55-90 mol % structural units derived from propylene and 10-45 mol % structural units derived from a C2-20 α-olefin (excluding propylene) and has an intrinsic viscosity [η] (dL/g) (measured in 135° C. decalin) satisfying a specific relationship with the MFR.

7 Claims, 2 Drawing Sheets

THERMOPLASTIC RESIN COMPOSITION FOR SEALING SOLAR CELL, SHEET FOR SEALING SOLAR CELL AND SOLAR CELL

TECHNICAL FIELD

The present invention relates to a thermoplastic resin composition for sealing a solar cell, a sheet for sealing a solar cell and to a solar cell. The present invention relates, more specifically to a thermoplastic resin composition as a material for forming a sheet for sealing a solar cell between a surface material and a rear surface material comprising a plate-like matter or a sheet-like matter of glass, plastic and the like, a sheet for sealing a solar cell which is formed from the above thermoplastic resin composition and a solar cell equipped with the sheet.

BACKGROUND ART

In general, an ethylene-vinyl acetate copolymer (abbreviated as EVA) blended with organic peroxide has so far been used as a material for forming a sheet for sealing a solar cell because it is flexible and has a high transparency and has excellent long-term durability when blended with additives such as an appropriate weather resistant stabilizing agent, an adhesion promoter and the like.

However, EVA has a low melting point and involves problems such as poor heat resistance which brings about thermal deformation at an environmental temperature at which a solar cell module is used, and therefore a cross-linked structure is formed in EVA by blending it with organic peroxide, whereby a sheet for sealing a solar cell having heat resistance is provided.

Publicly known sheet molding methods by which polyolefins can be molded are used for forming a sheet for sealing a solar cell, but has the problem that if it is blended with organic peroxide as described above, it is forced to be molded at low temperature in order to prevent the organic peroxide from being decomposed and a high speed productivity is inhibited.

Further, in producing a solar cell having a constitution of a surface protective layer (glass, plastics), a sheet for sealing a solar cell, a power module, a sheet for sealing a solar cell, and a surface protective layer (glass, plastics), two steps of a temporary adhesion step by vacuum heat lamination and a cross-linking step by organic peroxide using a high temperature oven are usually employed. Several tens of minutes are required for the above cross-linking step by organic peroxide, and therefore shortening of time in the cross-linking step or elimination of the cross-linking step itself is strongly required.

Further, there exists the concern that when a sheet for sealing a solar cell formed from EVA is used over a long period of time, an adverse effect is exerted on a power module due to the decomposition gas (acetic acid gas) of EVA or a vinyl acetate group present in EVA itself to reduce power generation efficiency.

Accordingly, a sheet for sealing a solar cell which is prepared by using an ethylene•α-olefin copolymer in place of EVA is proposed in order to avoid the problems of the EVA-made sheet for sealing a solar cell described above (Japanese Patent Application Laid-Open No. 2000-91611 (patent document 1)). It is expected that an adverse effect exerted on a power module is reduced by using the ethylene•α-olefin copolymer, but the ethylene•α-olefin copolymer is inferior in a balance between heat resistance and flexibility and does not exhibit good heat resistance if it is not cross-linked, and therefore it has been difficult to produce a sheet for sealing a solar cell by eliminating a cross-linking step. Patent document 1: Japanese Patent Application Laid-Open No. 2000-91611

DISCLOSURE OF THE INVENTION

Problems to be Solved by the Invention

Accordingly, the present inventors have worked on development of a non cross-liked sheet for sealing a solar cell in which polypropylene or a copolymer comprising polypropylene as a main component, and having an excellent heat resistance, is a base. However, it has been found that there is still room for improvement in terms of flexibility and transparency of a sheet for sealing a solar cell formed from the above materials as compared with a sheet for sealing a solar cell formed from EVA.

It has been found as a point of particularly marked improvement that when a thermal laminating step (a step in which a solar cell element (a power module), a sheet for sealing a solar cell and glass or a back sheet are superposed and heated to thereby adhere or fuse them with each other) is carried out at low temperature, the sheet for sealing a solar cell is clouded and its transparency is damaged in a certain case.

An object of the present invention is to solve the above problems in a sheet for sealing a solar cell. Specifically, an object of the present invention is to provide a sheet for sealing a solar cell which does not generate decomposition gas exerting an adverse effect on a solar cell element, which is excellent in heat resistance, flexibility, transparency, mechanical strength and solar cell sealing property if not cross-linked, which can be thermally laminated in a wide temperature range and which is excellent in a sealing property of a power module and a material used for producing the sheet for sealing a solar cell.

Means to Solve the Problems

Intensive research by the present inventors has resulted in a finding that the problems described above can be solved by using a specific propylene-based material, and thus the present invention has been accomplished.

The thermoplastic resin composition of the present invention for sealing a solar cell comprises:
(A) 0 to 70 parts by weight of a propylene-based polymer satisfying the following requisite (a) and
(B) 30 to 100 parts by weight of a propylene-based copolymer satisfying the following requisite (b) (provided that a total amount of (A) and (B) is 100 parts by weight);
(a): a melting point observed in differential scanning calorimetry is 100° C. or higher,
(b): MFR measured at 230° C. and a load of 2.16 kg according to ASTM D-1238 falls in a range of 0.01 to 100 g/10 minutes, and at least one of the following requisites (b-1) and (b-2) is satisfied;
(b-1): a syndiotactic triad fraction (rr fraction) measured by a $^{13}$C-NMR method is 60% or more and
(b-2): a structural unit derived from propylene is contained in an amount of 55 to 90 mole %, and a structural unit derived from at least one olefin selected from α-olefins having 2 to 20 carbon atoms (excluding propylene) is contained in an amount of 10 to 45 mole % (provided that the total of the structural unit derived from propylene and the structural unit derived from at least one olefin selected from α-olefins having 2 to 20 carbon atoms (excluding propylene) is 100 mole %); and an intrinsic viscosity [η](dL/g) measured in decalin at 135° C. and MFR (g/10 minutes, 230° C., load: 2.16 kg) described above satisfy a relational equation:

$$1.50 \times MFR^{(-0.20)} \leq [\eta] \leq 2.65 \times MFR^{(-0.20)}$$

The thermoplastic resin composition for sealing a solar cell described above may contain 0.01 to 10 parts by weight of a coupling agent (X) based on total 100 parts by weight of the propylene-based polymer (A) and the propylene-based copolymer (B) each described above.

The propylene-based polymer (A) described above includes an isotactic propylene-based polymer (A-1) and a syndiotactic propylene-based polymer (A-2).

A second thermoplastic resin composition of the present invention for sealing a solar cell is characterized in that it is obtained by subjecting (A) 0 to 70 parts by weight of a propylene-based polymer satisfying the following requisite (a), (B) 30 to 100 parts by weight of a propylene-based copolymer satisfying the following requisite (b) (a total amount of (A) and (B) is 100 parts by weight) and a coupling agent (X) to heat treatment under the presence of organic peroxide;
(a): a melting point observed in differential scanning calorimetry is 100° C. or higher,
(b): MFR measured at 230° C. and a load of 2.16 kg according to ASTM D-1238 falls in a range of 0.01 to 100 g/10 minutes, and at least one of the following requisites (b-1) and (b-2) is satisfied;
(b-1): a syndiotactic triad fraction (rr fraction) measured by a $^{13}$C-NMR method is 60% or more and
(b-2): a structural unit derived from propylene is contained in an amount of 55 to 90 mole %, and a structural unit derived from at least one olefin selected from α-olefins having 2 to 20 carbon atoms (excluding propylene) is contained in an amount of 10 to 45 mole % (provided that the total of the structural unit derived from propylene and the structural unit derived from at least one olefin selected from α-olefins having 2 to 20 carbon atoms (excluding propylene) is 100 mole %); and an intrinsic viscosity [η] (dL/g) measured in decalin at 135° C. and MFR (g/10 minutes, 230° C., load: 2.16 kg) described above satisfy a relational equation:

$$1.50 \times MFR^{(-0.20)} \leq [\eta] \leq 2.65 \times MFR^{(-0.20)}$$

Further, the sheet of the present invention for sealing a solar cell is characterized in that it is formed from either of the thermoplastic resin compositions for sealing a solar cell as described above.

The thermoplastic resin compositions for sealing a solar cell described above may not be cross-linked.

Use of the present invention includes the use of either of the thermoplastic resin compositions for sealing a solar cell described above for producing a sheet for sealing a solar cell.

The thermoplastic resin composition constituting the sheet for sealing a solar cell described above may not be cross-linked.

The solar cell of the present invention is characterized in that it is equipped with the sheet for sealing a solar cell described above.

Effect of the Invention

Use of the thermoplastic resin composition of the present invention for sealing a solar cell makes it possible to produce a sheet for sealing a solar cell which does not generate decomposition gas exerting an adverse effect on a solar cell and which is excellent in heat resistance, flexibility, solar cell sealing property (making thermal lamination possible in a broad temperature range), mechanical strength and transparency even if the composition is not cross-linked.

Accordingly, use of the thermoplastic resin composition of the present invention for sealing a solar cell makes it unnecessary to cross-link the above composition and therefore makes it possible to shorten the time required for molding the sheet for sealing a solar cell and producing the solar cell to a large extent, and the solar cell can be readily recycled after use.

Further, the sheet for sealing a solar cell can be improved in cloudiness if the thermal laminating step in producing the solar cell is carried out at low temperature, and the sheet for sealing a solar cell has a good stress absorbing performance, so that the power module (solar cell element) can be prevented from being cracked.

EXPLANATION OF THE CODE

Figure 1:
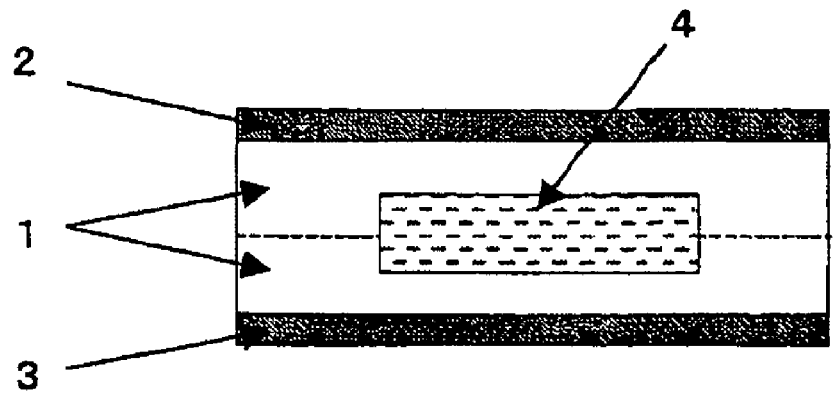
FIG. 1 is one example of a form in which a sheet for sealing a solar cell is applied.

1 Sheet for sealing a solar cell
2 Surface protective layer 1 (PET and the like)
3 Surface protective layer 2 (glass and the like)
4 Solar cell element
5 Pseudo module (aluminum)
6 Sealed sheet sample
7 PET (50 μm)
8 Glass (3 mm t)
9 500 μm sheet (sealed sheet sample)
10 PET (50 μm, transparent)

BEST MODE FOR CARRYING OUT THE INVENTION

The present invention is explained in further detail below.

Thermoplastic Resin Composition for Sealing a Solar Cell

The thermoplastic resin composition of the present invention for sealing a solar cell is characterized in that it comprises 0 to 70 parts by weight of the specific propylene-based polymer (A) and 30 to 100 parts by weight of the specific propylene-based copolymer (B).

Further, a second thermoplastic resin composition of the present invention for sealing a solar cell is characterized in that it is obtained by subjecting 0 to 70 parts by weight of the specific propylene-based polymer (A), 30 to 100 parts weight of the specific propylene-based copolymer (B) and the coupling agent (X) to heat treatment under the presence of organic peroxide.

Propylene-Based Polymer (A)

The propylene-based polymer (A) used in the present invention includes propylene homopolymers and copolymers of propylene with at least one α-olefin having 2 to 20 carbon atoms excluding propylene. In this connection, the α-olefin having 2 to 20 carbon atoms excluding propylene includes ethylene, 1-butene, 1-pentene, 1-hexene, 4-methyl-1-pentene, 1-octene, 1-decene, 1-dodecene, 1-tetradecene, 1-hexadecene, 1-octadecene, 1-eicocene and the like. Ethylene and α-olefins having 4 to 10 carbon atoms (1-butene, 1-pentene, 1-hexene, 4-methyl-1-pentene, 1-octene and the like) are preferred.

The above α-olefins may form random copolymers or block copolymers with propylene.

A structural unit derived from the above α-olefins may be contained in the propylene-based polymer (A) in a proportion of 35 mole % or less, preferably 30 mole % or less.

A melting point of the propylene-based polymer (A) observed in differential scanning calorimetry is 100° C. or higher, preferably 100 to 160° C. and more preferably 110 to 150° C.

The differential scanning calorimetry is carried out in the following manner. A sample of about 5 mg is filled in a dedicated aluminum pan and heated from 30° C. up to 200° C. at 320° C./minute by means of DSCPyris 1 or DSC 7 manufactured by PerkinElmer, Inc., held at 200° C. for 5 minutes and then cooled down from 200° C. to 30° C. at 10° C./minute. It is further held at 30° C. for 5 minutes, and then the melting point is determined from an endothermic curve in heating at 10° C./minute. When plural peaks are detected in DSC measurement, the peak detected at the highest temperature side is defined as the melting point (Tm).

A melt flow rate (MFR) of the propylene-based polymer (A) measured under conditions of 230° C. and a load of 2.16 kg according to ASTM D 1238 falls in a range of 0.01 to 1000 g/10 minutes, preferably 0.05 to 100 g/10 minutes.

The structure of the propylene-based polymer (A) may either be that of an isotactic structure or of a syndiotactic structure and can be selected, as described later, considering a compatibility with the propylene-based copolymer (B).

Isotactic propylene-based polymer (A-1):

An isotactic propylene-based polymer (A-1) which is one form of the propylene-based polymer (A) is described in detail below.

The isotactic propylene-based polymer (A-1) which is one form of the propylene-based polymer (A) includes propylene homopolymers, block copolymers (comprising usually 3 to 30 wt % of a normal decane soluble rubber component) and random copolymers (random copolymers in which α-olefin having 2 to 20 carbon atoms excluding propylene is contained in a proportion of, for example, exceeding 0 mole % and 9 mole % or less, preferably 1 mole % or more and 7 mole % or less based on total 100 mole % of propylene and the α-olefin having 2 to 20 carbon atoms), and they can be selected and used according to physical properties required in a sheet for sealing a solar cell. Further, two or more kinds of polymers can be used in combination.

An isotactic pentad fraction (mmmm fraction) of the isotactic propylene-based polymer (A-1) which is measured by an NMR method is not specifically restricted, and is usually 90% or more, preferably 95% or more. The isotactic pentad fraction (mmmm fraction) is measured and calculated by a method described in Japanese Patent Application Laid-Open No. 2003-147135.

The isotactic propylene-based polymer (A-1) can be produced by polymerizing propylene or copolymerizing propylene with other α-olefins under the presence of a Ziegler catalyst comprising a solid catalyst component containing magnesium, titanium, halogen and an electron donor as essential components, an organoaluminum compound and an electron donor or a metallocene catalyst prepared by using a metallocene compound as one component of the catalyst.

Syndiotactic Propylene-Based Polymer (A-2):

Next, a syndiotactic propylene-based polymer (A-2) (hereinafter referred to merely as the "polymer (A-2)") which is one form of the propylene-based polymer (A) is described in detail below.

The syndiotactic propylene-based polymer (A-2) comprises 90 to 100 mole % of a structural unit derived from propylene and 0 to 10 mole % of a structural unit derived from at least one olefin selected from ethylene and α-olefins having 4 to 20 carbon atoms (provided that the total of both units is 100 mole %).

In this regard, the α-olefins having 4 to 20 carbon atoms include ethylene, 1-butene, 3-methyl-1-butene, 1-pentene, 1-hexene, 4-methyl-1-pentene, 1-octene, 1-decene, 1-dodecene, 1-tetradecene, 1-hexadecene, 1-octadecene, 1-eicocene and the like.

The syndiotactic propylene-based polymer (A-2) is a propylene polymer comprising usually 90 to 100 mole % of the structural unit derived from propylene and 0 to 10 mole % of the structural unit derived from at least one olefin selected from ethylene and α-olefins having 4 to 20 carbon atoms (provided that the total of both units is 100 mole %), preferably 91 to 100 mole % of the structural unit derived from propylene and 0 to 9 mole % of the structural unit derived from at least one olefin selected from ethylene and α-olefins having 4 to 20 carbon atoms (provided that the total of both units is 100 mole %).

The syndiotactic propylene-based polymer (A-2) preferably satisfies the following requisites [1] and [2]:
[1] a syndiotactic pentad fraction (rrrr fraction) measured by $^{13}$C-NMR is 85% or more; and
[2] a melting point (Tm) determined by differential scanning calorimetry (hereinafter referred to as DSC) is 100° C. or higher.

The requisites [1] and [2] are explained below.
Requisite [1]:

A syndiotactic pentad fraction (rrrr fraction, pentad syndiotacticity) of the syndiotactic propylene-based polymer (A-2) measured by a $^{13}$C-NMR method is 85% or more, preferably 90% or more, more preferably 93% or more and further preferably 94% or more. The polymer (A-2) in which a rrrr fraction falls in the above range is excellent in molding property, heat resistance, transparency and rigidity, and it has good characteristics as crystalline polypropylene and is therefore preferred. Use of a catalyst described later and setting of polymerization conditions described later make it possible to produce the polymer (A-2) in which a rrrr fraction falls in the above range. An upper limit of the rrrr fraction is not specifically restricted, and is 100% or less, usually, for example, 99% or less.

The syndiotactic pentad fraction (rrrr fraction) is measured in the following manner.

The rrrr fraction is determined from Prrrr (an absorption intensity originating from methyl of the third unit in a part in which five propylene units are continuously bonded in a syndiotactic manner) in a $^{13}$C-NMR spectrum and Pw (an absorption intensity originating from all methyl groups of the propylene units) according to the following equation (1):

$$rrrr \text{ fraction} = Prrrr/Pw \quad (1)$$

NMR measurement is carried out, for example, in the following manner. 0.35 g of a sample is heated and dissolved in 2.0 ml of hexachlorobutadiene. This solution is filtrated through a glass filter (G2), and then a mixed solution obtained by adding 0.5 ml of deuterated benzene is put into an NMR tube having an inner diameter of 10 mm. Then, $^{13}$C-NMR measurement is carried out at 120° C. by means of a GX-500 type NMR measuring apparatus manufactured by JEOL Ltd. The integration frequency is 10,000 times or more.

Requisite [2]:

The higher the melting point (Tm) of the syndiotactic propylene-based polymer (A-2) which is obtained by differential scanning calorimetry (DSC) is, the more preferred, and to be specific, it is preferred in the order of 156° C. or higher, 155° C. or higher, 150° C. or higher, 147° C. or higher, 145° C. or higher, 115° C. or higher and 100° C. or higher. An upper limit of the melting point (Tm) is not specifically restricted, and is usually, for example, 170° C.

Further, higher heat of fusion (ΔH) of the syndiotactic propylene-based polymer (A-2) which is measured together with the above melting point (Tm) is more preferred, and to be specific, it is preferred in the order of 55 mJ/mg or more, 52 mJ/mg or more, 40 mJ/mg or more, 20 mJ/mg or more and 10 mJ/mg or more. An upper limit of the heat of fusion (ΔH) is not specifically restricted, and is usually, for example, 120 mJ/mg.

The differential scanning calorimetry is carried out in the following manner. A sample of about 5 mg is filled in a dedicated aluminum pan and heated from 30° C. up to 200° C. at 320° C./minute by means of DSCPyris 1 or DSC 7 manufactured by PerkinElmer, Inc., [and it] is held at 200° C. for 5 minutes and then cooled down from 200° C. to 30° C. at 10° C./minute. It is further held at 30° C. for 5 minutes, and then the melting point is determined from an endothermic curve in heating at 10° C./minute. When plural peaks are detected in DSC measurement, a peak detected at the highest temperature side is defined as the melting point (Tm). The polymer (A-2) in which the melting point (Tm) falls in the above range is excellent in molding property, heat resistance and mechanical characteristics, and has good characteristics as crystalline polypropylene and is therefore preferred. Use of a catalyst described later and setting of polymerization conditions described later make it possible to produce the polymer (A-2) in which the melting point (Tm) falls in the above range.

The syndiotactic propylene-based polymer (A-2) of the present invention further satisfies preferably the following requisite [3] in addition to the requisites [1] and [2] described above:

[3] An amount of a n-decane soluble part is 1% by weight or less.

The requisite [3] is explained below.

Requisite [3]:

The amount of the n-decane soluble part of the syndiotactic propylene-based polymer (A-2) is 1% by weight or less, preferably 0.8% by weight or less and further preferably 0.6% by weight or less. The above amount of n-decane soluble part is an index staying in close relation with the blocking characteristic of a syndiotactic propylene polymer or a molding obtained from the above polymer, and the small amount of n-decane soluble part usually means that the amount of a low crystalline component is small. That is, the syndiotactic propylene-based polymer (A-2) satisfying the requisite [3] has very good blocking resistance characteristic.

The syndiotactic propylene-based polymer (A-2) of the present invention preferably satisfies the following requisites [a] to [d]:

[a] a tensile elastic modulus falls in a range of 150 to 2000 MPa,

[b] a tensile braking strength is 15 MPa or more,

[c] an internal haze value of a pressed sheet having a thickness of 1 mm is 50% or less and

[d] a needle penetrating temperature is 100° C. or higher.

The requisites [a] to [d] are explained in detail below.

Requisite [a]:

A tensile elastic modulus of the syndiotactic propylene-based polymer (A-2) falls in a range of 150 to 2000 MPa, preferably 300 to 1800 MPa and more preferably 500 to 1500 MPa.

To be specific, the above tensile elastic modulus is a value measured by the following procedure. First, a JIS No. 3 dumbbell is punched from a pressed sheet having a thickness of 1 mm according to JIS K6301 and used for an evaluation sample. In measurement, the tensile elastic modulus is measured at a span distance of 30 mm and a tensile rate of 30 mm/minute at 23° C. by means of a tensile test machine Instron 1123 manufactured by Instron Co., and an average value obtained by measuring it three times is employed.

The syndiotactic propylene-based polymer (A-2) in which a tensile elastic modulus falls in the above range has excellent mechanical characteristics and strength, and has good characteristics as crystalline polypropylene and is therefore preferred. Use of a catalyst described later and setting of polymerization conditions described later make it possible to produce the polymer (A-2) in which a tensile elastic modulus falls in the above range.

Requisite [b]:

A tensile braking strength of the syndiotactic propylene-based polymer (A-2) falls in a range of 15 MPa or more, preferably 18 MPa or more, more preferably 20 MPa or more and further preferably 30 MPa or more.

To be specific, the above tensile braking strength is a value measured by the following procedure. First, a JIS No. 3 dumbbell is punched from a pressed sheet having a thickness of 1 mm according to JIS K6301 and used for an evaluation sample. In measurement, the tensile braking strength is measured at a span distance of 30 mm and a tensile rate of 30 mm/minute at 23° C. by means of the tensile test machine Instron 1123 manufactured by Instron Co., and an average value obtained by measuring it three times is employed.

The syndiotactic propylene-based polymer (A-2) [in] for which the tensile braking strength falls in the above range has good characteristics as crystalline polypropylene and is therefore preferred. Use of a catalyst described later and setting of polymerization conditions described later make it possible to produce the polymer (A-2) in which a tensile braking strength falls in the above range.

Requisite [c]:

An internal haze value of the syndiotactic propylene-based polymer (A-2) is 50% or less, preferably 45% or less.

The above internal haze value is an average value obtained by measuring twice, an internal haze of a pressed sheet test piece having a thickness of 1 mm by means of a digital turbidity meter NDH-20D manufactured by Nippon Denshoku Industries Co., Ltd.

The syndiotactic propylene-based polymer (A-2) in which an internal haze falls in the above range has excellent [in] transparency, and has good characteristics as crystalline polypropylene and is therefore preferred. Use of a catalyst described later and setting of polymerization conditions described later make it possible to produce the polymer (A-2) in which the internal haze value falls in the above range.

Requisite [d]:

[A] The needle penetrating temperature of the syndiotactic propylene-based polymer (A-2) falls in a range of 100° C. or higher, preferably 115° C. or higher. The needle penetrating temperature (referred to in a certain case as a softening point determined by TMA measurement) can be measured in the following manner.

A pressed sheet test piece having a thickness of 1 mm is used, and a pressure of 2 kgf/cm² is applied on a flat indenter of 1.8 mmφ at a heating rate of 5° C./minute by means of SS-120 manufactured by Seiko Instruments Inc. or Q-400 manufactured by TA Instrument Co., Ltd. to determine a needle penetrating temperature (° C.) from a TMA curve.

The syndiotactic propylene-based polymer (A-2) in which the needle penetrating temperature falls in the above range is excellent in heat resistance, and has good characteristics as crystalline polypropylene and is therefore preferred. Use of a catalyst described later and setting of polymerization conditions described later make it possible to produce the polymer (A-2) in which the needle penetrating temperature falls in the above range.

Suitably used as a catalyst in producing the syndiotactic propylene-based polymer (A-2) is a polymerization catalyst (cat-1) comprising:

(K) a bridged metallocene compound represented by the following Formula [1] (referred to as a component (K)) and (L) at least one compound (referred to as a component (L)) selected from:

(L-1) an organoaluminum oxy-compound (referred to as a component (L-1)), (L-2) a compound capable of reacting with the bridged metallocene compound (K) described above to form an ion pair (referred to as a component (L-2)) and (L-3) an organoaluminum compound (referred to as a component (L-3)) or a polymerization catalyst (cat-2) in which the above catalyst (cat-1) is supported on a particulate carrier. However, it is by no means restricted to the above catalyst as long as the polymer produced satisfies the requisites of the propylene polymer (A).

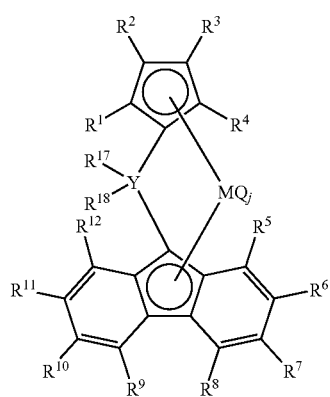

[1]

In Formula [1] described above, $R^1$, $R^2$, $R^3$ and $R^4$ are selected from a hydrogen atom, a hydrocarbon group and a silicon-containing group, and $R^2$ and $R^3$ may be linked with each other to form a ring; $R^5$, $R^6$, $R^8$, $R^9$, $R^{11}$ and $R^{12}$ are selected from a hydrogen atom, a hydrocarbon group and a silicon-containing group; $R^7$ and $R^{10}$ are not a hydrogen atom and selected from a hydrocarbon group and a silicon-containing group, and they may be the same as or different from each other; and in at least one adjacent group combination selected from $R^5$ and $R^6$, $R^7$ and $R^8$, $R^8$ and $R^9$, $R^9$ and $R^{10}$ and $R^{11}$ and $R^{12}$, the above adjacent groups may be linked with each other to form a ring.

$R^{17}$ and $R^{18}$ are a hydrogen atom, a hydrocarbon group having 1 to 20 carbon atoms or a silicon-containing group, and they may be the same as or different from each other; and the substituents may be linked with each other to form a ring.

M is Ti, Zr or Hf; Y is carbon; Q is selected in the same combination or different combinations from halogen, a hydrocarbon group, an anion ligand and a neutral ligand capable of coordination by a lone electron pair; and j is an integer of 1 to 4.

The specific examples of the component (K) satisfying the above definition are listed below:
cyclopropylidene(cyclopentadienyl)(3,6-di-tert-fluorenyl) zirconium dichloride, cyclobutylidene(cyclopentadienyl)(3, 6-di-tert-fluorenyl)zirconium, dichloride, cyclopentylidene (cyclopentadienyl)(3,6-di-tert-fluorenyl)zirconium dichloride, cyclohexylidene(cyclopentadienyl)(3,6-di-tert-fluorenyl)zirconium dichloride, cycloheptylidene(cyclopentadienyl)(3,6-di-tert-fluorenyl)zirconium dichloride, dibenzylmethylene(cyclopentadienyl)(3,6-di-tert-butylfluorenyl) zirconium dichloride, dibenzylmethylene (cyclopentadienyl)-(octamethyloctahydrodibenzofluorenyl) zirconium dichloride, di-n-butylmethylene (cyclopentadienyl)(2,7-dimethyl-3,6-di-tert-butylfluorenyl) zirconium dichloride, di-n-butylmethylene (cyclopentadienyl)(2,7-di(2,4,6-trimethylphenyl)-3,6-di-tert-butylfluorenyl)zirconium dichloride, di-n-butylmethylene(cyclopentadienyl)(2,7-diphenyl-3,6-di-tert-butylfluorenyl)zirconium dichloride, di-n-butylmethylene (cyclopentadienyl)(2,7-di(3,5-dimethylphenyl)-3,6-di-tert-butylfluorenyl)zirconium dichloride, di-n-butylmethylene (cyclopentadienyl)(2,3,6,7-tetra-tert-butylfluorenyl) zirconium dichloride, di-n-butylmethylene (cyclopentadienyl)(2,7-di(4-methylphenyl)-3,6-di-tert-butylfluorenyl)zirconium dichloride, di-n-butylmethylene (cyclopentadienyl)(2,7-dinaphthyl-3,6-di-tert-butylfluorenyl)zirconium dichloride, di-n-butylmethylene (cyclopentadienyl)(2,7-di(4-tert-butylphenyl)-3,6-di-tert-butylfluorenyl)zirconium dichloride, diisobutylmethylene (cyclopentadienyl)(2,7-dimethyl-3,6-di-tert-butylfluorenyl) zirconium dichloride, diisobutylmethylene (cyclopentadienyl)(2,7-di(2,4,6-trimethylphenyl)-3,6-di-tert-butylfluorenyl)zirconium dichloride, diisobutylmethylene(cyclopentadienyl)(2,7-diphenyl-3,6-di-tert-butylfluorenyl)zirconium dichloride, diisobutylmethylene(cyclopentadienyl)(2,7-di(3,5-dimethylphenyl)-3,6-di-tert-butylfluorenyl)zirconium dichloride, diisobutylmethylene(cyclopentadienyl)(2,3,6,7-tetra-tert-butylfluorenyl)zirconium dichloride, diisobutylmethylene (cyclopentadienyl)(2,7-di(4-methylphenyl)-3,6-di-tert-butylfluorenyl)zirconium dichloride, diisobutylmethylene (cyclopentadienyl)(2,7-dinaphthyl-3,6-di-tert-butylfluorenyl)zirconium dichloride, diisobutylmethylene (cyclopentadienyl)(2,7-di(4-tert-butylphenyl)-3,6-di-tert-butylfluorenyl)zirconium dichloride, dibenzylmethylene (cyclopentadienyl)(2,7-dimethyl-3,6-di-tert-butylfluorenyl) zirconium dichloride (in addition to the above, called as well 1,3-diphenylisopropylidene(cyclopentadienyl)-(2,7-dimethyl-3,6-di-tert-butylfluorenyl)zirconium dichloride; hereinafter, an alias name is omitted), dibenzylmethylene(cyclopentadienyl)(2,7-di(2,4,6-trimethylphenyl)-3,6-di-tert-butylfluorenyl)zirconium dichloride, dibenzylmethylene (cyclopentadienyl)(2,7-diphenyl-3,6-di-tert-butylfluorenyl)

zirconium dichloride, dibenzylmethylene(cyclopentadienyl)(2,7-di(3,5-dimethylphenyl)-3,6-di-tert-butylfluorenyl) zirconium dichloride, dibenzylmethylene(cyclopentadienyl)(2,3,6,7-tetra-tert-butylfluorenyl)zirconium dichloride, dibenzylmethylene(cyclopentadienyl)(2,7-di(4-methylphenyl)-3,6-di-tert-butylfluorenyl)zirconium dichloride, dibenzylmethylene(cyclopentadienyl)(2,7-dinaphthyl-3,6-di-tert-butylfluorenyl)zirconium dichloride, dibenzylmethylene(cyclopentadienyl)(2,7-di(4-tert-butylphenyl)-3,6-di-tert-butylfluorenyl)zirconium dichloride, diphenethylmethylene(cyclopentadienyl)(2,7-dimethyl-3,6-di-tert-butylfluorenyl)zirconium dichloride, diphenethylmethylene(cyclopentadienyl)(2,7-diphenyl-3,6-di-tert-butylfluorenyl)zirconium dichloride, di(benzhydryl)methylene(cyclopentadienyl)(2,7-dimethyl-3,6-di-tert-butylfluorenyl)zirconium dichloride, di(benzhydryl)methylene(cyclopentadienyl)(2,7-diphenyl-3,6-di-tert-butylfluorenyl)zirconium dichloride, di(cumyl)methylene(cyclopentadienyl)(2,7-dimethyl-3,6-di-tert-butylfluorenyl)zirconium dichloride, di(cumyl)methylene(cyclopentadienyl)(2,7-di-phenyl-3,6-di-tert-butylfluorenyl)zirconium dichloride, di(1-phenyl-ethyl)methylene(cyclopentadienyl)(2,7-dimethyl-3,6-di-tert-butylfluorenyl)zirconium dichloride, di(1-phenyl-ethyl)methylene(cyclopentadienyl)(2,7-diphenyl-3,6-di-tert-butylfluorenyl)zirconium dichloride, di(cyclohexylmethyl)methylene(cyclopentadienyl)(2,7-dimethyl-3,6-di-tert-butylfluorenyl)zirconium dichloride, di(cyclohexylmethyl)methylene(cyclopentadienyl)(2,7-diphenyl-3,6-di-tert-butylfluorenyl)zirconium dichloride, di(cyclopentylmethyl)methylene(cyclopentadienyl)(2,7-dimethyl-3,6-di-tert-butylfluorenyl)zirconium dichloride, di(cyclopentylmethyl)methylene(cyclopentadienyl)(2,7-diphenyl-3,6-di-tert-butylfluorenyl)zirconium dichloride, di(naphthylmethyl)methylene(cyclopentadienyl)(2,7-dimethyl-3,6-di-tert-butylfluorenyl)zirconium dichloride, di(naphthylmethyl)methylene(cyclopentadienyl)(2,7-diphenyl-3,6-di-tert-butylfluorenyl)zirconium dichloride, di(biphenylmethyl)methylene(cyclopentadienyl)(2,7-dimethyl-3,6-di-tert-butylfluorenyl)zirconium dichloride, di(biphenylmethyl)methylene(cyclopentadienyl)(2,7-diphenyl-3,6-di-tert-butylfluorenyl)zirconium dichloride, (benzyl)(n-butyl)methylene(cyclopentadienyl)(2,7-dimethyl-3,6-di-tert-butylfluorenyl)zirconium dichloride, (benzyl)(n-butyl)methylene(cyclopentadienyl)(2,7-diphenyl-3,6-di-tert-butylfluorenyl)zirconium dichloride, (benzyl)(cumyl)methylene(cyclopentadienyl)(2,7-dimethyl-3,6-di-tert-butylfluorenyl)zirconium dichloride, (benzyl)(cumyl)methylene(cyclopentadienyl)(2,7-diphenyl-3,6-di-tert-butylfluorenyl)zirconium dichloride, cyclopropylidene(cyclopentadienyl)(2,7-dimethyl-3,6-di-tert-butylfluorenyl)zirconium dichloride, cyclopropylidene(cyclopentadienyl)(2,7-diphenyl-3,6-di-tert-butylfluorenyl)zirconium dichloride, cyclobutylidene(cyclopentadienyl)(2,7-dimethyl-3,6-di-tert-butylfluorenyl)zirconium dichloride, cyclobutylidene(cyclopentadienyl)(2,7-diphenyl-3,6-di-tert-butylfluorenyl)zirconium dichloride, cyclopentylidene(cyclopentadienyl)(2,7-dimethyl-3,6-di-tert-butylfluorenyl)zirconium dichloride, cyclopentylidene(cyclopentadienyl)(2,7-diphenyl-3,6-di-tert-butylfluorenyl)zirconium dichloride, cyclohexylidene(cyclopentadienyl)(2,7-dimethyl-3,6-di-tert-butylfluorenyl)zirconium dichloride, cyclohexylidene(cyclopentadienyl)(2,7-diphenyl-3,6-di-tert-butylfluorenyl)zirconium dichloride, cycloheptylidene(cyclopentadienyl)(2,7-dimethyl-3,6-di-tert-butylfluorenyl)zirconium dichloride, cycloheptylidene(cyclopentadienyl)(2,7-diphenyl-3,6-di-tert-butylfluorenyl)zirconium dichloride, dibenzylmethylene(cyclopentadienyl)(2,7-dimethyl-3,6-dimethyl-butylfluorenyl)zirconium dichloride, di-n-butylmethylene(cyclopentadienyl)(2,7-dimethyl-3,6-dimethyl-butylfluorenyl)zirconium dichloride, dibenzylmethylene(cyclopentadienyl)(2,7-dimethyl-3,6-dicumyl-butylfluorenyl)zirconium dichloride, di-n-butylmethylene(cyclopentadienyl)(2,7-dimethyl-3,6-dicumyl-butylfluorenyl)zirconium dichloride, dibenzylmethylene(cyclopentadienyl)(2,7-dimethyl-3,6-di(trimethylsilyl)-butylfluorenyl)zirconium dichloride, di-n-butylmethylene(cyclopentadienyl)(2,7-dimethyl-3,6-di(trimethylsilyl)-butylfluorenyl)zirconium dichloride, dibenzylmethylene(cyclopentadienyl)(2,7-dimethyl-3,6-diphenyl-butylfluorenyl)zirconium dichloride, di-n-butylmethylene(cyclopentadienyl)(2,7-dimethyl-3,6-diphenyl-butylfluorenyl)zirconium dichloride, dibenzylmethylene(cyclopentadienyl)(2,7-dimethyl-3,6-dibenzyl-butylfluorenyl)zirconium dichloride, di-n-butylmethylene(cyclopentadienyl)(2,7-dimethyl-3,6-dibenzyl-butylfluorenyl)zirconium dichloride, dibenzylmethylene(cyclopentadienyl)(2,7-dimethyl-3,6-dimethyl-butylfluorenyl)zirconium dichloride, di-n-butylmethylene(cyclopentadienyl)(2,7-dimethyl-3,6-dimethyl-butylfluorenyl)zirconium dichloride, diphenylmethylene(cyclopentadienyl)(2,7-dimethyl-3,6-di-tert-butylfluorenyl)zirconium dichloride, diphenylmethylene(cyclopentadienyl)(2,7-diphenyl-3,6-di-tert-butylfluorenyl)zirconium dichloride, di(p-tolyl)methylene(cyclopentadienyl)(2,7-dimethyl-3,6-di-tert-butylfluorenyl)zirconium dichloride, di(p-tolyl)methylene(cyclopentadienyl)(2,7-diphenyl-3,6-di-tert-butylfluorenyl)zirconium dichloride, di(p-chlorophenyl)methylene(cyclopentadienyl)(2,7-dimethyl-3,6-ditert-butylfluorenyl)zirconium dichloride, di(p-chlorophenyl)methylene(cyclopentadienyl)(2,7-diphenyl-3,6-di-tert-butylfluorenyl)zirconium dichloride, di(m-chlorophenyl)methylene(cyclopentadienyl)(2,7-dimethyl-3,6-di-tert-butylfluorenyl)zirconium dichloride, di(m-chlorophenyl)methyl ene(cyclopentadienyl)(2,7-diphenyl-3,6-di-tert-butylfluorenyl)zirconium dichloride, di(p-bromophenyl)methylene(cyclopentadienyl)(2,7-dimethyl-3,6-di-tert-butylfluorenyl)zirconium dichloride, di(p-bromophenyl)methylene(cyclopentadienyl)(2,7-diphenyl-3,6-di-tert-butylfluorenyl)zirconium dichloride, di(m-trifluoromethyl-phenyl)methylene(cyclopentadienyl)(2,7-dimethyl-3,6-di-tert-butylfluorenyl)zirconium dichloride, di(m-trifluoromethyl-phenyl)methylene(cyclopentadienyl)(2,7-diphenyl-3,6-di-tert-butylfluorenyl)zirconium dichloride, di(p-trifluoromethyl-phenyl)methylene(cyclopentadienyl)(2,7-dimethyl-3,6-di-tert-butylfluorenyl)zirconium dichloride, di(p-trifluoromethyl-phenyl)methylene(cyclopentadienyl)(2,7-diphenyl-3,6-di-tert-butylfluorenyl)zirconium dichloride, di(p-tert-butyl-phenyl)methylene(cyclopentadienyl)(2,7-dimethyl-3,6-di-tert-butylfluorenyl)zirconium dichloride, di(p-tert-butyl-phenyl)methylene(cyclopentadienyl)(2,7-diphenyl-3,6-di-tert-butylfluorenyl)zirconium dichloride, di(p-n-butyl-phenyl)methylene(cyclopentadienyl)(2,7-dimethyl-3,6-di-tert-butylfluorenyl)zirconium dichloride, di(p-n-butyl-phenyl)methylene(cyclopentadienyl)(2,7-diphenyl-3,6-di-tert-butylfluorenyl)zirconium dichloride, di(p-biphenyl)methylene(cyclopentadienyl)(2,7-dimethyl-3,6-di-tert-butylfluorenyl)zirconium dichloride, dip-biphenyl)methylene(cyclopentadienyl)(2,7-diphenyl-3,6-di-tert-butylfluorenyl)zirconium dichloride, di(1-naphthyl)methylene(cyclopentadienyl)(2,7-dimethyl-3,6-di-tert-butylfluorenyl)zirconium dichloride, di(1-naphthyl)methylene (cyclopentadienyl)(2,7-diphenyl-3,6-di-tert-butylfluorenyl) zirconium dichloride, di(2-naphthyl)methylene(cyclopentadienyl)(2,7-dimethyl-3,6-di-tert-butylfluorenyl)zirconium dichloride, di(2-naphthyl)methylene(cyclopentadienyl)(2,7-diphenyl-3,6-di-tert-butylfluorenyl)zirconium dichloride, di(naphthylmethyl)methylene(cyclopentadienyl)(2,7-dimethyl-3,6-di-tert-butylfluorenyl)zirconium dichloride, di(naphthylmethyl)methylene(cyclopentadienyl)(2,7-diphenyl-3,6-di-tert-butylfluorenyl)zirconium dichloride, di(p-isopropylphenyl)methylene(cyclopentadienyl)(2,7-dimethyl-3,6-di-tert-butylfluorenyl)zirconium dichloride, di(p-isopropylphenyl)methylene(cyclopentadienyl)(2,7-diphenyl-3,6-di-tert-butylfluorenyl)zirconium dichloride, di(biphenylmethyl)methylene(cyclopentadienyl)(2,7-dimethyl-3,6-di-tert-butylfluorenyl)zirconium dichloride, di(biphenylmethyl)methylene(cyclopentadienyl)(2,7-diphenyl-3, 6-di-tert-butylfluorenyl)zirconium dichloride, diphenylsilylene(cyclopentadienyl)(2,7-dimethyl-3,6-di-tert-butylfluorenyl)zirconium dichloride, diphenylsilylene (cyclopentadienyl)(2,7-diphenyl-3,6-di-tert-butylfluorenyl) zirconium dichloride and the like.

Among the compounds described above, the compounds in which $R^6$ and $R^{11}$ in Formula [1] are an aryl group or a substituted aryl group such as phenyl, tolyl, t-butylphenyl, dimethylphenyl, trimethylphenyl, biphenyl and the like are preferably used since they provide the syndiotactic propylene polymer having a high melting point.

Further examples thereof are compounds obtained by replacing zirconium in the foregoing compounds shown as the examples with hafnium and titanium and bridged metallocene compounds obtained by replacing dichloride with difluoride, dibromde and diiodide and replacing dichloride with dimethyl and methylethyl in the compounds described above.

The bridged metallocene compound (K) described above can be produced by publicly known production processes, and is not specifically restricted. The publicly known production processes include, for example, production processes described in WO2001/27124 and WO2004/08777 applied by the present inventors. The above metallocene compounds can be used alone or in combination of two or more kinds thereof The polymerization catalyst component (L) described above is selected from at least one compound selected from the organoaluminum oxy-compound (L-1), the compound (L-2) capable of reacting with the metallocene compound (K) described above to form an ion pair and the organoalumiunm compound (L-3). The catalyst used in producing the polymer (A-2) is further constituted, if necessary, from (C) a particulate carrier. The respective components are specifically explained below.

(L-1) Organoaluminum Oxy-Compound:

Aluminoxane which is publicly known can be used as is as the organoaluminum oxy-compound (L-1). Specifically capable of being used are compounds represented by the following Formula [2]:

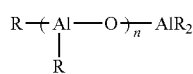

[2]

in Formula [2] described above, R each represents independently a hydrocarbon group having 1 to 10 carbon atoms, and n represents an integer of 2 or more;
and/or Formula [3]:

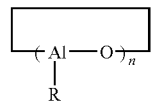

[3]

in Formula [3] described above, R represents a hydrocarbon group having 1 to 10 carbon atoms, and n represents an integer of 2 or more. In particular, methylaluminoxane in which R is methyl and n is 3 or more, preferably 10 or more is used. A small amount of organoalumiunm compounds may be included in the above aluminoxanes.

Further, the organoaluminum oxy-compound (L-1) also includes modified methylaluminoxane represented by the following Formula [4]:

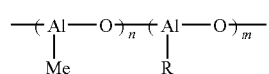

[4]

in Formula [4] described above, R represents a hydrocarbon group having 1 to 10 carbon atoms, and m and n each represent independently an integer of 2 or more.

The above modified methylaluminoxane is prepared by using trimethylaluminum and alkylaluminum other than trimethylaluminum. The above compound [4] is usually called MMAO. Such MMAO may be prepared, for example, by methods described in U.S. Pat. No. 4,960,878 and the like, or commercial products can be used as is.

(L-2) Compound Capable of Reacting with the Bridged Metallocene Compound (K) to Form an Ion Pair:

Lewis acids, ionic compounds, borane compounds and carborane compounds described in Japanese Patent Application Laid-Open No. 501950/1989 and U.S. Pat. No. 5,321, 106 can be used as the compound (L-2) (hereinafter referred to as the ionic compound) which reacts with the bridged metallocene compound (K) to form an ion pair. Further, heteropoly compounds and isopoly compounds can be used as well.

(L-3) Organoaluminum Compound:

An organoaluminum compound represented by, for example, the following Formula [5] can be used as the organoaluminum compound (L-3) which comprises the olefin polymerization catalyst:

$$R^a{}_m Al(OR^b)_n H_p X_q \qquad (5)$$

wherein $R^a$ and $R^b$ may be the same as or different from each other and represent a hydrocarbon group having 1 to 15 carbon atoms, preferably 1 to 4 carbon atoms; X represents a halogen atom; m is a number of $0<m\leq3$; n is a number of $0\leq n<3$; p is a number of $0\leq p<3$; q is a number of $0\leq q<3$; and m+n+p+q=3.

The specific examples of the above compound include tri-n-alkylaluminum such as trimethylaluminum, triethylaluminum, tri-n-butylaluminum, trihexylaluminum, trioctylaluminum and the like;
branched trialkylaluminum such as triisopropylaluminum, triisobutylaluminum, tri-sec-butylaluminum, tri-tert-butylaluminum, tri-2-methylbutylaluminum, tri-3-methylhexylaluminum, tri-2-ethylhexylaluminum and the like; tricycloalkylaluminum such as tricyclohexylaluminum, tricyclooctylaluminum and the like; triarylaluminum such as triphenylaluminum, tritolylaluminum and the like; dialkylaluminum hydride such as diisopropylaluminum hydride, diisobutylaluminum hydride and the like; alkenylaluminum such as isoprenylaluminum represented by a formula (i-$C_4H_9$)$_x$Al$_y$($C_5H_{10}$)$_z$ (wherein x, y and z are a positive number, and $z \leqq 2x$);

alkylaluminum alkoxide such as isobutylaluminum methoxide, isobutylaluminum ethoxide and the like;

dialkylaluminum alkoxide such as dimethylaluminum methoxide, diethylaluminum ethoxide, dibutylaluminum butoxide and the like;

alkylaluminum sesquialkoxide such as ethylaluminum sesquiethoxide, butylaluminum sesquibutoxide and the like;

partially alkoxylated alkylaluminum which has an average composition represented by a formula $R^a_{2.5}Al(OR^b)_{0.5}$;

alkylaluminum aryloxide such as diethylaluminum phenoxide, diethyl aluminum (2,6-di-tert-4-methylphenoxide) and the like;

dialkylaluminum halide such as dimethylaluminum chloride, diethylaluminum chloride, dibutylaluminum chloride, diethylaluminum bromide, diisobutylaluminum chloride and the like;

alkylaluminum sesquihalide such as ethylaluminum sesquichloride, butylaluminum sesquichloride, ethylaluminum sesquibromide and the like;

partially halogenated alkylaluminum including alkylaluminum dihalide such as ethylaluminum dichloride and the like;

dialkylaluminum hydride such as diethylaluminum hydride, dibutylaluminum hydride and the like;

other partially hydrogenated alkylaluminum such as ethylaluminum dihydride, propylaluminum dihydride and the like;

partially alkoxylated and halogenated alkylaluminum such as ethylaluminumethoxy chloride, butylaluminumbutoxy chloride, ethylaluminumethoxy bromide and the like.

Trimethylaluminum and triisobutylaluminum are preferably used as the organoalumiunm compound (L-3) since they are readily available.

Further, in the catalyst used in producing the polymer (A-2), a carrier (C) can be used, if necessary, together with the bridged metallocene compound (K) represented by Formula [1] described above and at least one compound (L) selected from the organoaluminum oxy-compound (L-1), the compound (L-2) capable of reacting with the bridged metallocene compound (K) described above to form an ion pair and the organoalumiunm compound (L-3).

Carrier (C):

The carrier (C) described above (referred to as the component (C) in the present specification) is an inorganic or organic compound and is a granular or fine particulate solid matter. Among them, the inorganic compound is preferably porous oxides, inorganic chloride, clay, clay minerals and ion-exchangeable layer compounds.

Compounds capable of being used as the porous oxides are, specifically, $SiO_2$, $Al_2O_3$, MgO, ZrO, $TiO_2$, $B_2O_3$, CaO, ZnO, BaO, $ThO_2$ and the like, composites or mixtures containing them, for example, natural or synthetic zeolite, $SiO_2$—MgO, $SiO_2$-$Al_2O_3$, $SiO_2$—$TiO_2$, $SiO_2$—$V_2O_5$, $SiO_2$—$Cr_2O_3$, $SiO_2$—$TiO_2$—MgO and the like. Among them, compounds comprising $SiO_2$ and/or $Al_2O_3$ as a main component are preferred.

The porous oxides described above may contain small amounts of carbonate, sulfate, nitrate and oxide components such as $Na_2CO_3$, $K_2CO_3$, $CaCO_3$, $MgCO_3$, $Na_2SO_4$, $Al_2(SO_4)_3$, $BaSO_4$, $KNO_3$, $Mg(NO_3)_2$, $Al(NO_3)_3$, $Na_2O$, $K_2O$, $Li_2O$ and the like.

$MgCl_2$, $MgBr_2$, $MnCl_2$, $MnBr_2$ and the like are used as the inorganic halides. The inorganic halides may be used as is or crushed using a ball mill or a vibrating mill. Further, capable of being used are the inorganic halides which are dissolved in a solvent such as alcohol and the like and which are then precipitated in a fine particle form by adding a precipitating agent.

The clay described above is usually constituted from clay minerals as main components. Also, the ion-exchangeable layer compounds described above are compounds having a crystalline structure in which faces constituted by virtue of an ionic bond are superposed parallel by exerting a weak bonding force on each other, and ions contained therein are exchangeable. Large parts of clay minerals are ion-exchangeable layer compounds. Not only natural products but also artificial synthetic products can be used as the above clays, clay minerals and ion-exchangeable layer compounds. Further, clays, clay minerals and ionic crystalline compounds having a layered crystalline structure such as a hexagonal close-packed structure, an antimony type, a $CdCl_2$ type, a $CdI_2$ type and the like can be shown as the examples of the clays, the clay minerals and the ion-exchangeable layer compounds.

The ion-exchangeable layer compounds described above may be layered compounds in a state in which spaces between layers are expanded by making use of an ion-exchanging property to exchange exchangeable ions present between the layers with different large bulky ions. They are preferably clays and clay minerals and particularly preferably montmorillonite, vermiculite, pectolite, taeniolite and synthetic mica.

Granular or fine particulate solid matters having a particle diameter falling in a range of 3 to 300 μm can be used as the organic compounds. Specific examples thereof are (co)polymers produced by using α-olefins having 2 to 14 carbon atoms such as ethylene, propylene, 1-butene, 4-methyl-1-pentene and the like as a main component or (co)polymers produced by using vinylcyclohexane and styrene as main components and modified products thereof.

Further, an organic compound component (D) (referred to as a component (D) in the present specification) such as alcohols, phenolic compounds, carboxylic acids, phosphorus compounds, sulfonic acid salts and the like can be included as well, if necessary, as the catalyst component for the polymerization catalyst described above.

In the polymerization, the use methods and the addition order of the respective components are optionally selected, and the following methods are provided as the examples thereof.

(1) A method in which the component (K) is added alone to the polymerization reactor.

(2) A method in which the component (K) and the component (L) are added in an optional order to the polymerization reactor.

(3) A method in which a catalyst component prepared by supporting the component (K) on the carrier (C) and the component (L) are added in an optional order to the polymerization reactor.

(4) A method in which a catalyst component prepared by supporting the component (L) on the carrier (C) and the component (K) are added in an optional order to the polymerization reactor.

(5) A method in which a catalyst component prepared by supporting the component (K) and the component (L) on the carrier (C) is added to the polymerization reactor.

In the methods (2) to (5) described above, at least two or more of the respective components may be brought into contact in advance.

In the respective methods (4) and (5) described above in which the component (L) is supported, the component (L) which is not supported may be added, if necessary, in an optional order. In this case, the component (L) may be the same or different.

Further, olefin may be prepolymerized on the solid catalyst component prepared by supporting the component (K) on the carrier (C) and the solid catalyst component prepared by supporting the component (K) and the component (L) on the carrier (C), and the catalyst component may further be supported on the solid catalyst components which are subjected to prepolymerization.

In the present invention, the polymerization can be carried out by either of a liquid phase polymerization method such as solution polymerization and suspension polymerization and a gas phase polymerization method. An inactive hydrocarbon medium used in a liquid phase polymerization method includes, to be specific, aliphatic hydrocarbons such as propane, butane, pentane, hexane, heptane, octane, decane, dodecane, kerosene and the like; alicyclic hydrocarbons such as cyclopentane, cyclohexane, methylcyclopentane and the like; aromatic hydrocarbons such as benzene, toluene, xylene and the like; halogenated hydrocarbons such as ethylene chloride, chlorobenzene, dichloromethane and the like and mixtures thereof. Olefins themselves can also be used as the solvent.

In polymerizing olefin using the olefin polymerization catalyst described above, the component (K) is used in an amount of usually $10^{-9}$ to $10^{-1}$ mole, preferably $10^{-8}$ to $10^{-2}$ mole per liter of the reaction volume.

The component (L-1) is used in an amount of usually 0.01 to 5000, preferably 0.05 to 2000 in terms of a mole ratio ((L-1)/M) of the component (L-1) to the whole transition metal atoms (M) contained in the component (K). The component (L-2) is used in an amount of usually 1 to 10, preferably 1 to 5 in terms of a mole ratio ((L-2)/M) of the component (L-2) to the transition metal atoms (M) contained in the component (K). The component (L-3) is used in an amount of usually 10 to 5000, preferably 20 to 2000 in terms of a mole ratio ((L-3)/M) of an aluminum atom contained in the component (L-3) to the whole transition metal atoms (M) contained in the component (K).

The component (D) is used in an amount of usually 0.01 to 10, preferably 0.1 to 5 in terms of a mole ratio ((D)/(L-1)) when the component (L) is the component (L-1), in an amount of usually 0.01 to 10, preferably 0.1 to 5 in terms of a mole ratio ((D)/(L-2)) when the component (L) is the component (L-2) and in an amount of usually 0.01 to 2, preferably 0.005 to 1 in terms of a mole ratio ((D)/(L-3)) when the component (L) is the component (L-3).

A polymerization temperature of olefin carried out by using the above olefin polymerization catalyst falls in a range of usually −50 to +200° C., preferably 0 to 170° C. The polymerization pressure is usually an atmospheric pressure to 10 MPa, preferably an atmospheric pressure to 5 MPa in terms of a gauge pressure. The polymerization can be carried out by any of a batch method, a semi-continuous method and a continuous method. Further, the polymerization can be carried out as well by dividing into two or more stages in which reaction conditions are different. A molecular weight of the olefin polymer obtained can be controlled by allowing hydrogen to be present in the polymerization system or changing the polymerization temperature. Further, it can be controlled as well by changing an amount of the component (L) used.

When adding hydrogen, an amount thereof is suitably 0.001 to 100 NL per kg of the olefin.

Propylene-Based Copolymer (B)

The propylene-based copolymer (B) satisfies the following requisite (b).

(b): MFR measured at 230° C. and a load of 2.16 kg according to ASTM D-1238 falls in a range of 0.01 to 100 g/10 minutes, and at least one of the following requisites (b-1) and (b-2) is satisfied;

(b-1): a syndiotactic triad fraction (rr fraction) measured by a $^{13}$C-NMR method is 60% or more, (b-2): a structural unit derived from propylene is contained in an amount of 55 to 90 mole % (provided that the total of the structural unit derived from propylene and the structural unit derived from at least one olefin selected from α-olefins (excluding propylene) having 2 to 20 carbon atoms is 100 mole %), and a structural unit derived from at least one olefin selected from α-olefins having 2 to 20 carbon atoms (excluding propylene) is contained in an amount of 10 to 45 mole %; and an intrinsic viscosity [η] (dL/g) measured in decalin at 135° C. and MFR (g/10 minutes, 230° C., load: 2.16 kg) described above satisfy a relational equation:

$$1.50 \times MFR^{(-0.20)} \leq [\eta] \leq 2.65 \times MFR^{(-0.20)}$$

The requisite (b) is explained below in detail[s].
Requisite (b):
A melt flow rate (MFR: ASTM D-1238, 230° C., under a load of 2.16 kg) of the propylene-based copolymer (B) is 0.01 to 50 g/10 minutes, preferably 0.01 to 30 g/10 minutes.

Further, the propylene-based copolymer (B) satisfies at least one of the requisites (b-1) and (b-2).
Requisite (b-1):
First, the requisite (b-1) is explained.
A syndiotactic triad fraction (rr fraction, triad syndiotacticity) of the propylene-based copolymer (B) measured by a $^{13}$C-NMR method is 60% or more, preferably 70% or more and more preferably 75% or more. If the rr fraction falls in the above range, a stress absorbing performance of the sheet for sealing a solar cell is exhibited, and therefore it is preferred.

The rr fraction is determined from Prr (an absorption intensity originating in methyl of the second unit in a part in which three propylene units are continuously bonded in a syndiotactic manner) in a $^{13}$C-NMR spectrum and Pw (an absorption intensity originating in all methyls of the propylene units) according to the following equation (2):

$$rr \text{ fraction} = Prr/Pw \quad (2)$$

In this regard, when absorption originating in mr (absorption originating in both of at least a syndiotactic bond and an isotactic bond among three propylene units, used for determining Pmr (absorption intensity)), absorption originating in rr (absorption originating in methyl of the second unit in a part in which three propylene units are continuously bonded in a syndiotactic manner, used for determining Prr (absorption intensity)) or absorption originating in mm (absorption originating in methyl of the second unit in a part in which three propylene units are continuously bonded in an isotactic manner, used for determining Pmm (absorption intensity)) is overlapped with absorption originating in the comonomer, contribution of the comonomer component is not deducted, and the rr fraction is calculated as it is.

To be specific, the rr fraction is determined by carrying out [0018] to [0023] in a method for determining a syndiotactic parameter (SP value) described in [0018] to [0031] of Japanese Patent Application Laid-Open No. 2002-097325 and calculating from the integrated strengths of signals in the first region, the second region and the third region according to the equation (2) described above.

In the present invention, particularly the $rr_1$ value, to be specific, the value determined according to the method for determining a syndiotactic parameter (SP value) described in [0018] to [0031] of Japanese Patent Application Laid-Open No. 2002-097325 is 60% or more, preferably 65% or more and more preferably 70% or more. In other words, when absorption originating in mr (absorption originating in both of at least a syndiotactic bond and an isotactic bond among three propylene units, used for determining Pmr (absorption intensity)), absorption originating in rr (absorption originating in methyl of the second unit in a part in which three propylene units are continuously bonded in a syndiotactic manner, used for determining Prr (absorption intensity)) or absorption originating in mm (absorption originating in methyl of the second unit in a part in which three propylene units are continuously bonded in an isotactic manner, used for determining Pmm (absorption intensity)) is overlapped with absorption originating in the comonomer in calculation of the rr value described above, the $rr_1$ value is obtained by deducting contribution of the comonomer component.

In measurements of the rr value and the $rr_1$ value, measurement of NMR is carried out, for example, in the following manner. That is, 0.35 g of a sample is heated and dissolved in 2.0 ml of hexachlorobutadiene. This solution is filtrated through a glass filter (G2), and then a mixed solution obtained by adding 0.5 ml of deuterated benzene is put into an NMR tube having an inner diameter of 10 mm. Then, $^{13}$C-NMR measurement is carried out at 120° C. by means of a GX-400 type NMR measuring apparatus manufactured by JEOL Ltd. The integration frequency is 8,000 times or more.

Requisite (b-2):

Next, the requisite (b-2) is explained.

The propylene-based copolymer (B) contains the structural unit derived from propylene in an amount of 55 to 90 mole % and the structural unit derived from α-olefin having 2 to 20 carbon atoms (excluding propylene) in an amount of 10 to 45 mole %. In this connection, the total of the structural unit derived from propylene and the structural unit derived from α-olefin having 2 to 20 carbon atoms (excluding propylene) is 100 mole %.

The α-olefin having 2 to 20 carbon atoms (excluding propylene) includes ethylene, 3-methyl-1-butene, 1-butene, 1-pentene, 1-hexene, 4-methyl-1-pentene, 1-octene, 1-decene, 1-dodecene, 1-tetradecene, 1-hexadecene, 1-octadecene, 1-eicocene and the like. Ethylene, 1-butene, 1-hexene, 4-methyl-1-pentene and 1-octene are particularly preferred.

In the propylene-based copolymer (B), an intrinsic viscosity [η] (dL/g) measured in decalin at 135° C. and MFR (g/10 minutes) measured at 230° C. and a load of 2.16 kg according to ASTM D-1238 satisfy the following relational equation:

$$1.50 \times MFR^{(-0.20)} \leq [\eta] \leq 2.65 \times MFR^{(-0.20)}$$

more preferably $$1.80 \times MFR^{(-0.20)} \leq [\eta] \leq 2.50 \times MFR^{(-0.20)}$$

Other Requisites:

In the propylene-based copolymer (B), a melting point observed in differential scanning calorimetry (DSC) is preferably lower than 100° C. or the melting point is not preferably observed. In this regard, "the melting point is not observed" means that a crystal melting peak having a crystal heat of fusion of 1 J/g or more is not observed in a range of −150 to 200° C. The details of the melting point measuring conditions are described in the item of examples described later.

An intrinsic viscosity [η] of the propylene-based copolymer (B) measured in decalin at 135° C. is 0.1 to 10 dL/g, preferably 0.5 to 10 dL/g.

A crystallinity of the propylene-based copolymer (B) measured by X-ray diffraction is preferably 20% or less, more preferably 0 to 15%.

The above propylene-based copolymer (B) has a single glass transition temperature, and the glass transition temperature (Tg) obtained by differential scanning calorimetry (DSC) falls in a range of usually −50 to 10° C., preferably −40 to 0° C. and more preferably −35 to 0° C. If the propylene-based copolymer (B) has a glass transition temperature (Tg) falling in the range described above, it is excellent in a cold resistance and low temperature characteristics and exhibits a stress absorbing performance, and therefore it is preferred.

The differential scanning calorimetry (DSC) is measured, for example, in the following manner. A sample of about 10.00 mg is filled in a dedicated aluminum pan and heated from 30° C. up to 200° C. at 200° C./minute by means of DSCRDC 220 manufactured by Seiko Instruments Inc., and it is held at 200° C. for 5 minutes and then cooled down from 200° C. to −100° C. at 10° C./minute. It is further held at −100° C. for 5 minutes, and then the glass transition temperature (Tg) described above is determined from an endothermic curve in heating at 10° C./minute.

A molecular weight distribution ((Mw/Mn, in terms of polystyrene, Mw: weight average molecular weight, Mn: number average molecular weight) of the propylene-based copolymer (B) measured by GPC is preferably 3.5 or less, more preferably 3.0 or less and further preferably 2.5 or less.

The propylene-based copolymer (B) described above may be graft-modified in a part thereof by a polar monomer. The above polar monomer includes hydroxyl group-containing ethylenically unsaturated compounds, amino group-containing ethylenically unsaturated compounds, epoxy group-containing ethylenically unsaturated compounds, aromatic vinyl compounds, unsaturated carboxylic acids and derivatives thereof, vinyl ester compounds, vinyl chloride and the like.

The modified propylene-based copolymer (B) is obtained by graft-polymerizing the propylene-based copolymer (B) described above with the polar monomer. In graft-polymerizing the propylene-based copolymer (B) with the polar monomer described above, the polar monomer is used in an amount of usually 1 to 100 parts by weight, preferably 5 to 80 parts by weight based on 100 parts by weight of the propylene-based copolymer (B).

The above graft polymerization is carried out usually under the presence of a radical initiator. Organic peroxides and azo compounds can be used as the radical initiator. The radical initiator can also be used as it is by mixing with the propylene-based copolymer (B) and the polar monomer or it can be used as well after dissolved in a small amount of an organic solvent. The organic solvent can be used without any specific restrictions as long as it is an organic solvent which can dissolve the radical initiator.

The graft polymerization of the propylene-based copolymer (B) with the polar monomer may be carried out under the presence of a reducing substance. Use of the reducing substance makes it possible to enhance a graft amount of the polar monomer.

The graft modification of the propylene-based copolymer (B) by the polar monomer can be carried out by a method which has so far been publicly known, and it can be carried out, for example, by dissolving the propylene-based copolymer (B) in an organic solvent, then adding the polar monomer and the radical initiator to the solution and reacting them at a temperature of 70 to 200° C., preferably 80 to 190° C. for 0.5 to 15 hours, preferably 1 to 10 hours.

Further, the propylene-based copolymer (B) can be reacted with the polar monomer under the absence of a solvent by means of an extruder to thereby produce as well the modified propylene-based copolymer (B). The above reaction is carried out preferably at a temperature of not lower than a melting point of the propylene-based copolymer (B), to be specific, 120 to 250° C. usually for 0.5 to 10 minutes.

A modification amount (a graft amount of the polar monomer) of the modified propylene-based copolymer (B) thus obtained is usually 0.1 to 50% by weight, preferably 0.2 to 30% by weight and more preferably 0.2 to 10% by weight assuming that the modified copolymer accounts for 100% by weight.

If the modified propylene-based copolymer (B) described above is included in the thermoplastic resin composition of the present invention for sealing a solar cell, the above thermoplastic resin composition for sealing a solar cell is excellent in an adhesive property and a compatibility with other resins, and the sheet for sealing a solar cell is improved in a wetting property on a surface thereof in a certain case.

The propylene-based copolymer (B) can be produced by reacting propylene with α-olefin (excluding propylene) having 2 to 20 carbon atoms under the presence of an olefin polymerization catalyst comprising:
(I') a bridged metallocene compound represented by the following Formula [1,1] (referred to as a component (I') in the present specification) and
(II) at least one compound (referred to as a component (II) in the present specification) selected from:
(II-1) an organoaluminum oxy-compound (referred to as a component (II-1) in the present specification),
(II-2) a compound capable of reacting with the bridged metallocene compound described above to form an ion pair (referred to as a component (II-2) in the present specification) and
(II-3) an organoaluminum compound (referred to as a component (II-3) in the present specification). However, it [shall] is not [be] restricted to the above catalyst as long as the polymer produced satisfies the requisites of the propylene-based copolymer (B).

[11]

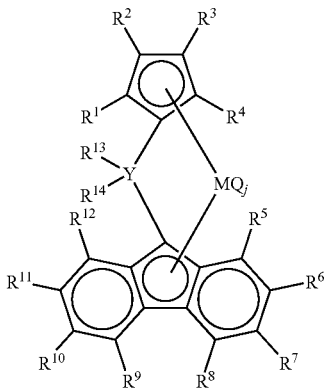

(wherein $R^1$, $R^2$, $R^3$, $R^4$, $R^5$, $R^8$, $R^9$ and $R^{12}$ are atoms or groups selected from a hydrogen atom, a hydrocarbon group and a silicon-containing group, and they may be the same as or different from each other, $R^6$ and $R^{11}$ are the same atom or the same group selected from a hydrogen atom, a hydrocarbon group and a silicon-containing group, $R^7$ and $R^{10}$ are the same atom or the same group selected from a hydrogen atom, a hydrocarbon group and a silicon-containing group, all of $R^6$, $R^7$, $R^{10}$ and $R^{11}$ are not hydrogen atoms at the same time, $R^2$ and $R^3$ may be linked with each other to form a ring, among $R^5$ to $R^{12}$, adjacent groups may be linked with each other to form a ring.

$R^{13}$ and $R^{14}$ are selected from an aryl group having 6 to 18 carbon atoms, an alkyl group having 1 to 40 carbon atoms, an alkylaryl group having 6 to 40 carbon atoms, a fluoroaryl group having 6 to 20 carbon atoms, a fluoroalkylaryl group having 7 to 40 carbon atoms, a chloroaryl group having 6 to 20 carbon atoms, a chloroalkylaryl group having 7 to 40 carbon atoms, a bromoaryl group having 6 to 20 carbon atoms, a bromoalkylaryl group having 7 to 40 carbon atoms, an iodoaryl group having 6 to 20 carbon atoms and an iodoalkylaryl group having 7 to 40 carbon atoms, and they may be the same as or different from each other, at least one of $R^{13}$ and $R^{14}$ is selected from an aryl group having 7 to 18 carbon atoms, a chloroaryl group having 6 to 20 carbon atoms, a chloroalkylaryl group having 7 to 40 carbon atoms, a bromoaryl group having 6 to 20 carbon atoms, a bromoalkylaryl group having 7 to 40 carbon atoms, an iodoaryl group having 6 to 20 carbon atoms, an iodoalkylaryl group having 7 to 40 carbon atoms and a fluoroalkylaryl group having 7 to 40 carbon atoms, M is Ti, Zr or Hf, Y is carbon or silicon, Q is selected in the same combination or different combinations from halogen, a hydrocarbon group, neutral, conjugate or non-conjugate diene having 10 or less carbon atoms, an anion ligand and a neutral ligand which is a lone electron pair and can be coordinated and j is an integer of 1 to 4).

The specific examples of the bridged metallocene compound represented by Formula [11] described above are shown below, but the scope of the present invention is not specifically restricted by them. In this connection, octamethyloctahydrodibenzofluorene shows a structure represented by Formula [1,2];
octamethyltetrahydrodicyclopentafluorene shows a structure represented by Formula [1,3];
and dibenzofluorene shows a structure represented by Formula [1,4].

[12]

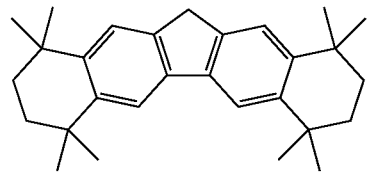

[13]

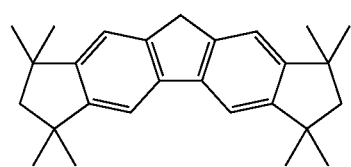

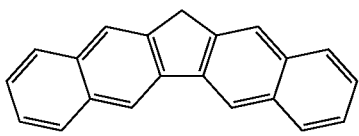

Di(p-chlorophenyl)methylene(cyclopentadienyl)(2,7-di-tert-butylfluorenyl)zirconium dichloride, di(p-chlorophenyl)methylene(cyclopentadienyl)(3,6-di-tert-butylfluorenyl)zirconium dichloride, di(p-chlorophenyl)methylene(cyclopentadienyl)(octamethyl-octahydrodibenzofluorenyl)zirconium dichloride, di(p-chlorophenyl)methylene(cyclopentadienyl)(octamethyl-tetrahydrodipentafluorenyl)zirconium dichloride, di(p-chlorophenyl)methylene(cyclopentadienyl)(dibenzofluorenyl)-zirconium dichloride, di(p-chlorophenyl)methylene-(cyclopentadienyl)(2,7-diphenyl-3,6-di-tert-butylfluorenyl)zirconium dichloride, di(p-chlorophenyl)methylene(cyclopentadienyl)(2,7-dimethyl-3,6-di-tert-butylfluorenyl)zirconium dichloride, di(p-chlorophenyl)methylene(cyclopentadienyl)(2,7-(trimethylphenyl)-3,6-di-tert-butylfluorenyl)zirconium dichloride, di(p-chlorophenyl)methylene(cyclopentadienyl)(2,7-(dimethylphenyl)-3,6-di-tert-butylfluorenyl)zirconium dichloride, di(p-chlorophenyl)methylene(cyclopentadienyl)-(2,3,6,7-tetra-tert-butylfluorenyl)zirconium dichloride, di(m-chlorophenyl)methylene(cyclopentadienyl)(2,7-di-tert-butylfluorenyl)zirconium dichloride, di(m-chlorophenyl)methylene(cyclopentadienyl)(3,6-di-tert-butylfluorenyl)zirconium dichloride, di(m-chlorophenyl)-methylene(cyclopentadienyl)(octamethyloctahydro-dibenzofluorenyl)zirconium dichloride, di(m-chlorophenyl)methylene(cyclopentadienyl)(octamethyltetrahydro-dicyclopentafluorenyl)zirconium dichloride, di(m-chlorophenyl)methylene(cyclopentadienyl)(dibenzofluorenyl)-zirconium dichloride, di(m-chlorophenyl)methylene-(cyclopentadienyl)(2,7-diphenyl-3,6-di-tert-butylfluorenyl)-zirconium dichloride, di(m-chlorophenyl)methylene-(cyclopentadienyl)(2,7-dimethyl-3,6-di-tert-butylfluorenyl)-zirconium dichloride, di(m-chlorophenyl)methylene-(cyclopentadienyl)(2,7-(trimethylphenyl)-3,6-di-tert-butylfluorenyl)zirconium dichloride, di(m-chlorophenyl)-methylene(cyclopentadienyl)(2,7-(dimethylphenyl)-3,6-di-tert-butylfluorenyl)zirconium dichloride, di(m-chlorophenyl)methylene(cyclopentadienyl)(2,3,6,7-tetra-tert-butylfluorenyl)zirconium dichloride, di(p-bromophenyl)methylene(cyclopentadienyl)(2,7-di-tert-butylfluorenyl)zirconium dichloride, di(p-bromophenyl)methylene(cyclopentadienyl)(3,6-di-tert-butylfluorenyl)zirconium dichloride, di(p-bromophenyl)methylene(cyclopentadienyl)(octamethyloctahydro-dibenzofluorenyl)zirconium dichloride, di(p-bromophenyl)methylene(cyclopentadienyl)(octamethyltetrahydro-dicyclopentafluorenyl)zirconium dichloride, di(p-bromophenyl)methylene(cyclopentadienyl)(dibenzofluorenyl)-zirconium dichloride, di(p-bromophenyl)methyl ene-(cyclopentadienyl) (2,7-diphenyl-3,6-di-tert-butylfluorenyl)zirconium dichloride, di(p-bromophenyl)methylene(cyclopentadienyl)(2,7-dimethyl-3,6-di-tert-butylfluorenyl)zirconium dichloride, di(p-bromophenyl)methylene(cyclopentadienyl)(2,7-(trimethylphenyl)-3,6-di-tert-butylfluorenyl)zirconium dichloride, di(p-bromophenyl)methylene(cyclopentadienyl)(2,7-(dimethylphenyl)-3,6-di-tert-butylfluorenyl)zirconium dichloride, di(p-bromophenyl)methylene(cyclopentadienyl)(2,3,6,7-tetra-tert-butylfluorenyl)zirconium dichloride, di(m-bromophenyl)methylene(cyclopentadienyl)(2,7-di-tert-butylfluorenyl)zirconium dichloride, di(m-bromophenyl)methylene(cyclopentadienyl)(3,6-di-tert-butylfluorenyl)zirconium dichloride, di(m-bromophenyl)methylene(cyclopentadienyl)(octamethyloctahydro-dibenzofluorenyl)zirconium dichloride, di(m-bromophenyl)methylene(cyclopentadienyl)(octamethyltetrahydro-dicyclopentafluorenyl)zirconium dichloride, di(m-bromophenyl)methylene(cyclopentadienyl)(dibenzofluorenyl)-zirconium dichloride, di(m-bromophenyl)methylene-(cyclopentadienyl)(2,7-diphenyl-3,6-di-tert-butylfluorenyl)-zirconium dichloride, di(m-bromophenyl)methylene-(cyclopentadienyl)(2,7-dimethyl-3,6-di-tert-butylfluorenyl)zirconium dichloride, di(m-bromophenyl)methylene(cyclopentadienyl)(2,7-(trimethylphenyl)-3,6-di-tert-butylfluorenyl)zirconium dichloride, di(m-bromophenyl)methylene(cyclopentadienyl)(2,7-(dimethylphenyl)-3,6-di-tert-butylfluorenyl)zirconium dichloride, di(m-bromophenyl)methylene(cyclopentadienyl)(2,3,6,7-tetra-tert-butylfluorenyl)zirconium dichloride, di(p-iodophenyl)methylene(cyclopentadienyl)(2,7-di-tert-butylfluorenyl)zirconium dichloride, di(p-iodophenyl)methylene(cyclopentadienyl)(3,6-di-tert-butylfluorenyl)zirconium dichloride, di(p-iodophenyl)methylene(cyclopentadienyl)(octamethyloctahydro-dibenzofluorenyl)zirconium dichloride, di(p-iodophenyl)methylene(cyclopentadienyl)(octamethyltetrahydro-dicyclopentafluorenyl)zirconium dichloride, di(p-iodophenyl)methylene(cyclopentadienyl)(dibenzofluorenyl)-zirconium dichloride, di(p-iodophenyl)methylene-(cyclopentadienyl)(2,7-diphenyl-3,6-di-tert-butylfluorenyl)zirconium dichloride, di(p-iodophenyl)methylene(cyclopentadienyl)(2,7-dimethyl-3,6-di-tert-butylfluorenyl)zirconium dichloride, di(p-iodophenyl)methylene(cyclopentadienyl)(2,7-(trimethylphenyl)-3,6-di-tert-butylfluorenyl)zirconium dichloride, di(p-iodophenyl)methylene(cyclopentadienyl)(2,7-(dimethylphenyl)-3,6-di-tert-butylfluorenyl)zirconium dichloride, di(p-iodophenyl)methylene(cyclopentadienyl)(2,3,6,7-tetra-tert-butylfluorenyl)zirconium dichloride, di(m-trifluoromethyl-phenyl)methylene(cyclopentadienyl)(2,7-di-tert-butylfluorenyl)zirconium dichloride, di(m-trifluoromethyl-phenyl)methylene(cyclopentadienyl)(3,6-di-tert-butylfluorenyl)zirconium dichloride, di(m-trifluoromethyl-phenyl)methylene(cyclopentadienyl)(octamethyloctahydrodibenzo-fluorenyl)zirconium dichloride, di(m-trifluoromethyl-phenyl)methylene(cyclopentadienyl)(octamethyltetrahydro-dicyclopentafluorenyl)zirconium dichloride, di(m-trifluoromethyl-phenyl)methylene(cyclopentadienyl)-(dibenzofluorenyl)zirconium dichloride, di(m-trifluoromethyl-phenyl)methylene(cyclopentadienyl)(2,7-diphenyl-3,6-di-tert-butylfluorenyl)zirconium dichloride, di(m-trifluoromethyl-phenyl)methylene(cyclopentadienyl)(2,7-dimethyl-3,6-di-tert-butylfluorenyl)zirconium dichloride, di(m-trifluoromethyl-phenyl)methylene(cyclopentadienyl)(2,7-(trimethylphenyl)-3,6-di-tert-butylfluorenyl)zirconium dichloride, di(m-trifluoromethyl-phenyl)methylene(cyclopentadienyl)(2,7-(dimethylphenyl)-3,6-di-tert-butylfluorenyl)zirconium dichloride, di(m-trifluoromethyl-phenyl)methylene-(cyclopentadienyl)(2,3,6,7-tetra-tert-butylfluorenyl)zirconium dichloride, di(p-trifluoromethyl-phenyl)methylene-(cyclopentadienyl)(2,7-di-tert-butylfluorenyl)zirconium dichloride, di(p-trifluoromethyl-phenyl)methylene-(cyclopentadienyl)(3,6-di-tert-butylfluorenyl)zirconium dichloride, di(p-trifluoromethyl-phenyl)methylene-(cyclopentadienyl)

(octamethyloctahydrodibenzofluorenyl)-zirconium dichloride, di(p-trifluoromethyl-phenyl)methylene-(cyclopentadienyl)(octamethyltetrahydrodicyclo-pentafluorenyl)zirconium dichloride, di(p-trifluoromethyl-phenyl)methylene-(cyclopentadienyl)(dibenzofluorenyl)zirconium dichloride, di(p-trifluoromethyl-phenyl)methylene-(cyclopentadienyl)(2,7-diphenyl-3,6-di-tert-butylfluorenyl)zirconium dichloride, di(p-trifluoromethyl-phenyl)methylene(cyclopentadienyl)(2,7-dimethyl-3,6-di-tert-butylfluorenyl)zirconium dichloride, di(p-trifluoromethyl-phenyl)methylene(cyclopentadienyl)(2,7-(trimethylphenyl)-3,6-di-tert-butylfluorenyl)zirconium dichloride, di(p-trifluoromethyl-phenyl)methylene-(cyclopentadienyl)(2,7-(dimethylphenyl)-3,6-di-tert-butylfluorenyl)zirconium dichloride, di(p-trifluoromethyl-phenyl)methylene-(cyclopentadienyl)(2,3,6,7-tetra-tert-butylfluorenyl)zirconium dichloride, di(p-trichloromethyl-phenyl)methylene-(cyclopentadienyl)(2,7-di-tert-butylfluorenyl)zirconium dichloride, di(p-trichloromethyl-phenyl)methylene-(cyclopentadienyl)(3,6-di-tert-butylfluorenyl)zirconium dichloride, di(p-trichloromethyl-phenyl)methylene-(cyclopentadienyl)(octamethyloctahydrodibenzofluorenyl)-zirconium dichloride, di(p-trichloromethyl-phenyl)-methylene(cyclopentadienyl)(octamethyltetrahydro-dicyclopentafluorenyl)zirconium dichloride, di(p-trichloromethyl-phenyl)methylene(cyclopentadienyl)-(dibenzofluorenyl)zirconium dichloride, di(p-trichloromethyl-phenyl)methylene(cyclopentadienyl)(2,7-diphenyl-3,6-di-tert-butylfluorenyl)zirconium dichloride, di(p-trichloromethyl-phenyl)methylene(cyclopentadienyl)(2,7-dimethyl-3,6-di-tert-butylfluorenyl)zirconium dichloride, di(p-trichloromethyl-phenyl)methylene(cyclopentadienyl)(2,7-(trimethylphenyl)-3,6-ditert-butylfluorenyl)zirconium dichloride, di(p-trichloromethyl-phenyl)methylene(cyclopentadienyl)(2,7-(dimethylphenyl)-3,6-di-tert-butylfluorenyl)zirconium dichloride, di(p-trichloromethyl-phenyl)methylene-(cyclopentadienyl)(2,3,6,7-tetra-tert-butylfluorenyl)zirconium dichloride, di(m-trichloromethyl-phenyl)methylene-(cyclopentadienyl)(2,7-di-tert-butylfluorenyl)zirconium dichloride, di(m-trichloromethyl-phenyl)methylene-(cyclopentadienyl)(3,6-di-tert-butylfluorenyl)zirconium dichloride, di(m-trichloromethyl-phenyl)methylene-(cyclopentadienyl)(octamethyloctahydrodibenzofluorenyl)-zirconium dichloride, di(m-trichloromethyl-phenyl)methylene(cyclopentadienyl)(octamethyltetrahydro-dicyclopentafluorenyl)zirconium dichloride, di(m-trichloromethyl-phenyl)methylene(cyclopentadienyl)-(dibenzofluorenyl)zirconium dichloride, di(m-trichloromethyl-phenyl)methylene(cyclopentadienyl)(2,7-diphenyl-3,6-di-tert-butylfluorenyl)zirconium dichloride, di(m-trichloromethyl-phenyl)methylene (cyclopentadienyl)(2,7-dimethyl-3,6-di-tert-butylfluorenyl)zirconium dichloride, di(m-trichloromethyl-phenyl)methylene(cyclopentadienyl)(2,7-(trimethylphenyl)-3,6-di-tert-butylfluorenyl)zirconium dichloride, di(m-trichloromethyl-phenyl)methylene(cyclopentadienyl)(2,7-(dimethylphenyl)-3,6-di-tert-butylfluorenyl)zirconium dichloride, di(m-trichloromethyl-phenyl)methylene-(cyclopentadienyl)(2,3,6,7-tetra-tert-butylfluorenyl)zirconium dichloride, di(p-biphenyl)methylene(cyclopentadienyl)(2,7-di-tert-butylfluorenyl)zirconium dichloride, di(p-biphenyl)methylene(cyclopentadienyl)(3,6-di-tert-butylfluorenyl)zirconium dichloride, di(p-biphenyl)methylene (cyclopentadienyl)(octamethyloctahydro-dibenzofluorenyl)zirconium dichloride, di(p-biphenyl)methylene (cyclopentadienyl)(octamethyltetrahydro-dicyclopentafluorenyl)zirconium dichloride, di(p-biphenyl)methylene(cyclopentadienyl)(dibenzofluorenyl)zirconium dichloride, di(p-biphenyl)methylene-(cyclopentadienyl)(2,7-diphenyl-3,6-di-tert-butylfluorenyl)zirconium dichloride, di(p-biphenyl)methylene(cyclopentadienyl)(2,7-dimethyl-3,6-di-tert-butylfluorenyl)zirconium dichloride, di(p-biphenyl)methylene(cyclopentadienyl)(2,7-(trimethylphenyl)-3,6-di-tert-butylfluorenyl)zirconium dichloride, di(p-biphenyl)methylene(cyclopentadienyl)(2,7-(dimethylphenyl)-3,6-di-tert-butylfluorenyl)zirconium dichloride, di(p-biphenyl)methylene(cyclopentadienyl)(2,3,6,7-tetra-tert-butylfluorenyl)zirconium dichloride, di(3,5-ditrifluoromethyl-phenyl)methylene(cyclopentadienyl)(2,7-di-tert-butylfluorenyl)zirconium dichloride, di(3,5-ditrifluoromethyl-phenyl)methylene(cyclopentadienyl)(3,6-di-tert-butylfluorenyl)zirconium dichloride, di(3,5-ditrifluoromethyl-phenyl)methylene(cyclopentadienyl)(octamethyloctahydrodibenzo-fluorenyl)zirconium dichloride, di(3,5-ditrifluoromethyl-phenyl)methylene(cyclopentadienyl)(octamethyltetrahydro-dicyclopentafluorenyl)zirconium dichloride, di(3,5-ditrifluoromethyl-phenyl)methylene(cyclopentadienyl)-(dibenzofluorenyl)zirconium dichloride, di(3,5-ditrifluoromethyl-phenyl)methylene(cyclopentadienyl)(2,7-diphenyl-3,6-di-tert-butylfluorenyl)zirconium dichloride, di(3,5-ditrifluoromethyl-phenyl)methylene(cyclopentadienyl)-(2,7-dimethyl-3,6-di-tert-butylfluorenyl)zirconium dichloride, di(3,5-ditrifluoromethyl-phenyl)methylene(cyclopentadienyl)-(2,7-(trimethylphenyl)-3,6-di-tert-butylfluorenyl)zirconium dichloride, di(3,5-ditrifluoromethyl-phenyl)methylene-(cyclopentadienyl)(2,7-(dimethylphenyl)-3,6-di-tert-butylfluorenyl)zirconium dichloride, di(3,5-ditrifluoromethyl-phenyl)methylene(cyclopentadienyl)(2,3,6,7-tetra-tert-butylfluorenyl)zirconium dichloride, di(3,5-dichloromethyl-phenyl)methylene(cyclopentadienyl)(2,7-di-tert-butylfluorenyl)zirconium dichloride, di(3,5-dichloromethyl-phenyl)methylene(cyclopentadienyl)(3,6-di-tert-butylfluorenyl)zirconium dichloride, di(3,5-dichloromethyl-phenyl)methylene(cyclopentadienyl)(octamethyloctahydrodibenzo-fluorenyl)zirconium dichloride, di(3,5-dichloromethyl-phenyl)-methylene(cyclopentadienyl)(octamethyltetrahydrodicyclo-pentafluorenyl)zirconium dichloride, di(3,5-dichloromethyl-phenyl)methylene(cyclopentadienyl)(dibenzofluorenyl)zirconium dichloride, di(3,5-dichloromethyl-phenyl)methylene-(cyclopentadienyl)(2,7-diphenyl-3,6-di-tert-butylfluorenyl)-zirconium dichloride, di(3,5-dichloromethyl-phenyl)methylene-(cyclopentadienyl)(2,7-dimethyl-3,6-ditert-butylfluorenyl)-zirconium dichloride, di(3,5-dichloromethyl-phenyl)methylene-(cyclopentadienyl)(2,7-(trimethylphenyl)-3,6-di-tert-butylfluorenyl)zirconium dichloride, di(3,5-dichloromethyl-phenyl)methylene(cyclopentadienyl)(2,7-(dimethylphenyl)-3,6-di-tert-butylfluorenyl)zirconium dichloride, di(3,5-dichloromethyl-phenyl)methylene(cyclopentadienyl)(2,3,6,7-tetra-tert-butylfluorenyl)zirconium dichloride, di(4-chloronaphthyl)methylene(cyclopentadienyl)(2,7-di-tert-butylfluorenyl)zirconium dichloride, di(4-chloronaphthyl)-methylene(cyclopentadienyl)(3,6-di-tert-butylfluorenyl)-zirconium dichloride, di(4-chloronaphthyl)methylene-(cyclopentadienyl)(octamethyloctahydrodibenzofluorenyl)-zirconium dichloride, di(4-chloronaphthyl)methylene-(cyclopentadienyl)(octamethyltetrahydrodicyclopentafluorenyl)-zirconium dichloride, di(4-chloronaphthyl)methylene-(cyclopentadienyl)(dibenzofluorenyl)zirconium dichloride, di(4-chloronaphthyl)methylene(cyclopentadienyl)(2,7-diphenyl-3,6-di-tert-butylfluorenyl)zirconium dichloride, di(4-chloronaphthyl)-methylene(cyclopentadienyl)(2,7-dimethyl-3,6-di-tert-butylfluorenyl)zirconium dichloride, di(4-chloronaphthyl)methylene(cyclopentadienyl)(2,7-(trimethylphenyl)-3,6-di-tert-butylfluorenyl)zirconium dichloride, di(4-chloronaphthyl)methylene(cyclopentadienyl)-(2,7-(dimethylphenyl)-3,6-di-tert-butylfluorenyl)zirconium dichloride, di(4-chloronaphthyl)methylene(cyclopentadienyl)-(2,3,6,7-tetra-tert-butylfluorenyl)zirconium dichloride, di(3-chloronaphthyl)methylene(cyclopentadienyl)(2,7-di-tert-butylfluorenyl)zirconium dichloride, di(3-chloronaphthyl)-methylene(cyclopentadienyl)(3,6-di-tert-butylfluorenyl)-zirconium dichloride, di(3-chloronaphthyl)methylene-(cyclopentadienyl)(octamethyloctahydrodibenzofluorenyl)-zirconium dichloride, di(3-chloronaphthyl)methylene-(cyclopentadienyl)(octamethyltetrahydrocyclopentafluorenyl)-zirconium dichloride, di(3-chloronaphthypmethylene-(cyclopentadienyl)(dibenzofluorenyl)zirconium dichloride, di(3-chloronaphthyl)methylene(cyclopentadienyl)(2,7-diphenyl-3,6-di-tert-butylfluorenyl)zirconium dichloride, di(3-chloronaphthyl)methylene(cyclopentadienyl)(2,7-dimethyl-3,6-di-tert-butylfluorenyl)zirconium dichloride, di(3-chloronaphthyl)methylene(cyclopentadienyl)(2,7-(trimethylphenyl)-3,6-di-tert-butylfluorenyl)zirconium dichloride, di(3-chloronaphthyl)methylene(cyclopentadienyl)-(2,7-(dimethylphenyl)-3,6-di-tert-butylfluorenyl)zirconium dichloride, di(3-chloronaphthyl)methylene(cyclopentadienyl)-(2,3,6,7-tetra-tert-butylfluorenyl)zirconium dichloride, di(5-chloronaphthyl)methylene(cyclopentadienyl)(2,7-di-tert-butylfluorenyl)zirconium dichloride, di(5-chloronaphthyl)-methylene(cyclopentadienyl)(3,6-di-tert-butylfluorenyl)-zirconium dichloride, di(5-chloronaphthyl)methylene-(cyclopentadienyl)(octamethyloctahydrodibenzofluorenyl)-zirconium dichloride, di(5-chloronaphthyl)methylene-(cyclopentadienyl)(octamethyltetrahydrocyclopentafluorenyl)-zirconium dichloride, di(5-chloronaphthyl)methylene-(cyclopentadienyl)(dibenzofluorenyl)zirconium dichloride, di(5-chloronaphthyl)methylene(cyclopentadienyl)(2,7-diphenyl-3,6-di-tert-butylfluorenyl)zirconium dichloride, di(5-chloronaphthyl)methylene(cyclopentadienyl)(2,7-dimethyl-3,6-di-tert-butylfluorenyl)zirconium dichloride, di(5-chloronaphthyl)methylene(cyclopentadienyl)(2,7-(trimethylphenyl)-3,6-di-tert-butylfluorenyl)zirconium dichloride, di(5-chloronaphthyl)methylene(cyclopentadienyl)-(2,7-(dimethylphenyl)-3,6-di-tert-butylfluorenyl)zirconium dichloride, di(5-chloronaphthyl)methylene(cyclopentadienyl)-(2,3,6,7-tetra-tert-butylfluorenyl)zirconium dichloride, phenyl(p-chlorophenyl)methylene(cyclopentadienyl)(2,7-di-tert-butylfluorenyl)zirconium dichloride, phenyl(p-chlorophenyl)methylene(cyclopentadienyl)(3,6-di-tert-butylfluorenyl)zirconium dichloride, phenyl(p-chlorophenyl)-methylene(cyclopentadienyl)(octamethyloctahydro-dibenzofluorenyl)zirconium dichloride, phenyl(p-chlorophenyl)-methylene(cyclopentadienyl)(octamethyltetrahydrocyclo-pentafluorenyl)zirconium dichloride, phenyl(p-chlorophenyl)-methylene(cyclopentadienyl)(dibenzofluorenyl)zirconium dichloride, phenyl(p-chlorophenyl)methylene(cyclopentadienyl)-(2,7-diphenyl-3,6-di-tert-butylfluorenyl)zirconium dichloride, phenyl(p-chlorophenyl)methylene(cyclopentadienyl)(2,7-dimethyl-3,6-di-tert-butylfluorenyl)zirconium dichloride, phenyl(p-chlorophenyl)methylene(cyclopentadienyl)(2,7-(trimethylphenyl)-3,6-di-tert-butyl fluorenyl)zirconium dichloride, phenyl(p-chlorophenyl)methylene(cyclopentadienyl)-(2,7-(dimethylphenyl)-3,6-di-tert-butylfluorenyl)zirconium dichloride, phenyl(p-chlorophenyl)methylene(cyclopentadienyl)-(2,3,6,7-tetra-tert-butylfluorenyl)zirconium dichloride, phenyl(m-chlorophenyl)methylene(cyclopentadienyl)(2,7-di-tert-butyl fluorenyl)zirconium dichloride, phenyl(m-chlorophenyl)-methylene(cyclopentadienyl)(3,6-di-tert-butylfluorenyl)-zirconium dichloride, phenyl(m-chlorophenyl)methylene-(cyclopentadienyl)(octamethyloctahydrodibenzofluorenyl)-zirconium dichloride, phenyl(m-chlorophenyl)methylene-(cyclopentadienyl)(octamethyltetrahydrodicyclopentafluorenyl)-zirconium dichloride, phenyl(m-chlorophenyl)methylene-(cyclopentadienyl)(dibenzofluorenyl)zirconium dichloride, phenyl(m-chlorophenyl)methylene(cyclopentadienyl)(2,7-diphenyl-3,6-di-tert-butylfluorenyl)zirconium dichloride, phenyl(m-chlorophenyl)methylene(cyclopentadienyl)(2,7-dimethyl-3,6-di-tert-butylfluorenyl)zirconium dichloride, phenyl(m-chlorophenyl)methylene(cyclopentadienyl)(2,7-(trimethylphenyl)-3,6-di-tert-butylfluorenyl)zirconium dichloride, phenyl(m-chlorophenyl)methylene(cyclopentadienyl)-(2,7-(dimethylphenyl)-3,6-di-tert-butylfluorenyl)zirconium dichloride, phenyl(m-chlorophenyl)methylene(cyclopentadienyl)-(2,3,6,7-tetra-tert-butylfluorenyl)zirconium dichloride, phenyl(m-trifluoromethyl-phenyl)methylene(cyclopentadienyl)-(2,7-di-tert-butylfluorenyl)zirconium dichloride, phenyl(m-trifluoromethyl-phenyl)methylene(cyclopentadienyl)(3,6-di-tert-butylfluorenyl)zirconium dichloride, phenyl(m-trifluoromethyl-phenyl)methylene(cyclopentadienyl)-(octamethyloctahydrodibenzofluorenyl)zirconium dichloride, phenyl(m-trifluoromethyl-phenyl)methylene(cyclopentadienyl)-(octamethyltetrahydrocyclopentafluorenyl)zirconium dichloride, phenyl(m-trifluoromethyl-phenyl)methylene-(cyclopentadienyl)(dibenzofluorenyl)zirconium dichloride, phenyl(m-trifluoromethyl-phenyl)methylene(cyclopentadienyl)-(2,7-diphenyl-3,6-di-tert-butylfluorenyl)zirconium dichloride, phenyl(m-trifluoromethyl-phenyl)methylene(cyclopentadienyl)-(2,7-dimethyl-3,6-di-tert-butylfluorenyl)zirconium dichloride, phenyl(m-trifluoromethyl-phenyl)methylene(cyclopentadienyl)-(2,7-(trimethylphenyl)-3,6-di-tert-butylfluorenyl)zirconium dichloride, phenyl(m-trifluoromethyl-phenyl)methylene-(cyclopentadienyl)(2,7-(dimethylphenyl)-3,6-di-tert-butylfluorenyl)zirconium dichloride, phenyl(m-trifluoromethyl-phenyl)methylene(cyclopentadienyl)(2,3,6,7-tetra-tert-butylfluorenyl)zirconium dichloride, naphthyl(p-chlorophenyl)methylene(cyclopentadienyl)(2,7-di-tert-butylfluorenyl)zirconium dichloride, naphthyl(p-chlorophenyl)methylene(cyclopentadienyl)(3,6-di-tert-butylfluorenyl)zirconium dichloride, naphthyl(p-chlorophenyl)methylene(cyclopentadienyl)(octamethyloctahydro-dibenzofluorenyl)zirconium dichloride, naphthyl(p-chlorophenyl)methylene(cyclopentadienyl)(octamethyltetrahydro-dicyclopentafluorenyl)zirconium dichloride, naphthyl(p-chlorophenyl)methylene(cyclopentadienyl)(dibenzofluorenyl)-zirconium dichloride, naphthyl(p-chlorophenyl)methylene(cyclopentadienyl)(2,7-diphenyl-3,6-di-tert-butylfluorenyl)zirconium dichloride, naphthyl(p-chlorophenyl)methylene(cyclopentadienyl)(2,7-dimethyl-3,6-di-tert-butylfluorenyl)zirconium dichloride, naphthyl(p-chlorophenyl)methylene(cyclopentadienyl)(2,7-(trimethylphenyl)-3,6-di-tert-butylfluorenyl)zirconium dichloride, naphthyl(p-chlorophenyl)methylene-(cyclopentadienyl)(2,7-(dimethylphenyl)-3,6-di-tert-butylfluorenyl)zirconium dichloride, naphthyl(p-chlorophenyl)methylene(cyclopentadienyl)(2,3,6,7-tetra-tert-butylfluorenyl)zirconium dichloride, naphthyl(m-chlorophenyl)methylene(cyclopentadienyl)(2,7-di-tert-butylfluorenyl)zirconium dichloride, naphthyl(m-chlorophenyl)methylene(cyclopentadienyl)(3,6-di-tert-butylfluorenyl)zirconium dichloride, naphthyl(m-chlorophenyl)methylene(cyclopentadienyl)(octamethyloctahydro-dibenzofluorenyl)zirconium dichloride, naphthyl(m-chlorophenyl)methylene(cyclopentadienyl)(octamethyltetrahydro-dicyclopentafluorenyl)zirconium dichloride, naphthyl(m-chlorophenyl)methylene(cyclopentadienyl)(dibenzofluorenyl)-zirconium dichloride, naphthyl(m-chlorophenyl)methylene-(cyclopentadienyl)(2,7-diphenyl-3,6-di-tert-butylfluorenyl)zirconium dichloride, naphthyl(m-chlorophenyl)methylene(cyclopentadienyl)(2,7-dimethyl-3,6-di-tert-butylfluorenyl)zirconium dichloride, naphthyl(m-chlorophenyl)methylene(cyclopentadienyl)(2,7-(trimethylphenyl)-3,6-di-tert-butylfluorenyl)zirconium dichloride, naphthyl(m-chlorophenyl)methylene-(cyclopentadienyl)(2,7-(dimethylphenyl)-3,6-di-tert-butylfluorenyl)zirconium dichloride, naphthyl(m-chlorophenyl)methylene(cyclopentadienyl)(2,3,6,7-tetra-tert-butylfluorenyl)zirconium dichloride, naphthyl(m-trifluoromethyl-phenyl)methylene(cyclopentadienyl)(2,7-di-tert-butylfluorenyl)zirconium dichloride, naphthyl(m-trifluoromethyl-phenyl)methylene(cyclopentadienyl)(3,6-di-tert-butylfluorenyl)zirconium dichloride, naphthyl(m-trifluoromethyl-phenyl)methylene(cyclopentadienyl)-(octamethyloctahydrodibenzofluorenyl)zirconium dichloride, naphthyl(m-trifluoromethyl-phenyl)methylene(cyclopentadienyl)-(octamethyltetrahydrodicyclopentafluorenyl)zirconium dichloride, naphthyl(m-trifluoromethyl-phenyl)methylene-(cyclopentadienyl)(dibenzofluorenyl)zirconium dichloride, naphthyl(m-trifluoromethyl-phenyl)methylene(cyclopentadienyl)-(2,7-diphenyl-3,6-di-tert-butylfluorenyl)zirconium dichloride, naphthyl(m-trifluoromethyl-phenyl)methylene(cyclopentadienyl)-(2,7-dimethyl-3,6-di-tert-butylfluorenyl)zirconium dichloride, naphthyl(m-trifluoromethyl-phenyl)methylene(cyclopentadienyl)-(2,7-(trimethylphenyl)-3,6-di-tert-butylfluorenyl)zirconium dichloride, naphthyl(m-trifluoromethyl-phenyl)methylene-(cyclopentadienyl)(2,7-(dimethylphenyl)-3,6-di-tert-butylfluorenyl)zirconium dichloride, naphthyl(m-trifluoromethyl-phenyl)methylene(cyclopentadienyl)(2,3,6,7-tetra-tert-butylfluorenyl)zirconium dichloride, (p-tolyl)(p-chlorophenyl)methylene(cyclopentadienyl)(2,7-di-tert-butylfluorenyl)zirconium dichloride, (p-tolyl)(p-chlorophenyl)methylene(cyclopentadienyl)(3,6-di-tert-butylfluorenyl)zirconium dichloride, (p-tolyl)(p-chlorophenyl)methylene(cyclopentadienyl)(octamethyloctahydrodibenzofluorenyl)zirconium dichloride, (p-tolyl)(p-chlorophenyl)methylene(cyclopentadienyl)(octamethyltetrahydro-dicyclopentafluorenyl)zirconium dichloride, (p-tolyl)(p-chlorophenyl)methylene(cyclopentadienyl)(dibenzofluorenyl)-zirconium dichloride, (p-tolyl)(p-chlorophenyl)methylene-(cyclopentadienyl)(2,7-diphenyl-3,6-di-tert-butylfluorenyl)zirconium dichloride, (p-tolyl)(p-chlorophenyl)methylene(cyclopentadienyl)(2,7-dimethyl-3,6-di-tert-butylfluorenyl)zirconium dichloride, (p-tolyl)(p-chlorophenyl)methylene(cyclopentadienyl)(2,7-(trimethylphenyl)-3,6-di-tert-butylfluorenyl)zirconium dichloride, (p-tolyl)(p-chlorophenyl)methylene-(cyclopentadienyl)(2,7-(dimethylphenyl)-3,6-di-tert-butylfluorenyl)zirconium dichloride, (p-tolyl)(p-chlorophenyl)methylene(cyclopentadienyl)(2,3,6,7-tetra-tert-butylfluorenyl)zirconium dichloride, (p-tolyl)(m-chlorophenyl)methylene(cyclopentadienyl)(2,7-di-tert-butylfluorenyl)zirconium dichloride, (p-tolyl)(m-chlorophenyl)methylene(cyclopentadienyl)(3,6-di-tert-butylfluorenyl)zirconium dichloride, (p-tolyl)(m-chlorophenyl)methylene(cyclopentadienyl)(octamethyloctahydro-dibenzofluorenyl)zirconium dichloride, (p-tolyl)(m-chlorophenyl)methylene(cyclopentadienyl)-(octamethyltetrahydrodicyclopentafluorenyl)zirconium dichloride, (p-tolyl)(m-chlorophenyl)methylene-(cyclopentadienyl)(dibenzofluorenyl)zirconium dichloride, (p-tolyl)(m-chlorophenyl)methylene(cyclopentadienyl)(2,7-diphenyl-3,6-di-tert-butylfluorenyl)zirconium dichloride, (p-tolyl)(m-chlorophenyl)methylene(cyclopentadienyl)(2,7-dimethyl-3,6-di-tert-butylfluorenyl)zirconium dichloride, (p-tolyl)(m-chlorophenyl)methylene(cyclopentadienyl)(2,7-(trimethylphenyl)-3,6-di-tert-butylfluorenyl)zirconium dichloride, (p-tolyl)(m-chlorophenyl)methylene-(cyclopentadienyl)(2,7-(dimethylphenyl)-3,6-di-tert-butylfluorenyl) zirconium dichloride, (p-tolyl)(m-chlorophenyl)methylene (cyclopentadienyl)(2,3,6,7-tetra-tert-butylfluorenyl) zirconium dichloride, (p-tolyl)(m-trifluoromethyl-phenyl)methylene(cyclopentadienyl)(2,7-di-tert-butylfluorenyl) zirconium dichloride, (p-tolyl)(m-trifluoromethyl-phenyl) methylene(cyclopentadienyl)(3,6-di-tert-butylfluorenyl) zirconium dichloride, (p-tolyl)(m-trifluoromethyl-phenyl) methylene(cyclopentadienyl)-(octamethyloctahydrodibenzofluorenyl)zirconium dichloride, (p-tolyl)(m-trifluoromethyl-phenyl)methylene (cyclopentadienyl)-(octamethyltetrahydrodicyclopentafluorenyl)zirconium dichloride, (p-tolyl)(m-trifluoromethyl-phenyl)methylene-(cyclopentadienyl) (dibenzofluorenyl)zirconium dichloride, (p-tolyl)(m-trifluoromethyl-phenyl)methylene(cyclopentadienyl)-(2,7-diphenyl-3,6-di-tert-butylfluorenyl)zirconium dichloride, (p-tolyl)(m-trifluoromethyl-phenyl)methylene-(cyclopentadienyl)(2,7-dimethyl-3,6-di-tert-butylfluorenyl)zirconium dichloride, (p-tolyl)(m-trifluoromethyl-phenyl)methylene (cyclopentadienyl)(2,7-(trimethylphenyl)-3,6-di-tert-butylfluorenyl)zirconium dichloride, (p-tolyl)(m-trifluoromethyl-phenyl)methylene(cyclopentadienyl)(2,7-(dimethylphenyl)-3,6-di-tert-butylfluorenyl)zirconium dichloride, (p-tolyl)(m-trifluoromethyl-phenyl)methylene (cyclopentadienyl)(2,3,6,7-tetra-tert-butylfluorenyl)zirconium dichloride and the like.

Further, compounds obtained by replacing zirconium in the compounds described above with hafnium and titanium and metallocene compounds obtained by replacing dichloride with difluoride, dibromide and diiodide and replacing dichloride with dimethyl and methylethyl in the compounds described above are also the metallocene compounds represented by Formula [11].

Further, metallocene compounds described in International Publication No. 2004-087775 can also be used as the bridged metallocene compound (I').

The bridged metallocene compound (I') can be produced with reference to publicly known processes. The publicly known production processes include, for example, a WO04/029062 pamphlet issued by the present applicants.

The metallocene compounds described above can be used alone or in combination of two or more kinds thereof.

Production Process for the Propylene-Based Copolymer (B):

In the polymerization, a use method of the respective components and an addition order thereof are optionally selected, and the following methods are shown as the examples thereof.

A method in which the component (I') and the component (II) are added in an optional order to a polymerization reactor.

In the method described above, at least two or more of the respective catalyst components may be brought into contact in advance.

In polymerizing olefin using the olefin polymerization catalyst described above, the component (I') is used in an amount of usually $10^{-9}$ to $10^{-1}$ mole, preferably $10^{-8}$ to $10^{-2}$ mole per liter of the reaction volume.

The component (II-1) is used in an amount of usually 0.01 to 5,000, preferably 0.05 to 2,000 in terms of a mole ratio ((II-1)/M) of the component (II-1) to the whole transition metal atoms (M) contained in the component (I'). The component (II-2) is used in an amount of usually 1 to 1,000, preferably 1 to 500 in terms of a mole ratio ((II-2)/M) of an aluminum atom contained in the component (II-2) to the whole transition metal atoms (M) contained in the component (I'). The component (II-3) is used in an amount of usually 1 to 10,000, preferably 1 to 5,000 in terms of a mole ratio ((II-3)/M) of the component (II-3) to the transition metal atom (M) contained in the component (a).

The propylene-based copolymer (B) is obtained by copolymerizing propylene with at least one olefin selected from α-olefins having 2 to 20 carbon atoms (excluding propylene) usually in a liquid phase under the presence of the olefin polymerization catalyst described above. In this case, a hydrocarbon solvent is usually used, however α-olefins may be used as the solvent. The hydrocarbon medium includes, to be specific, aliphatic hydrocarbons such as propane, butane, pentane, hexane, heptane, octane, decane, dodecane, kerosene and the like; alicyclic hydrocarbons such as cyclopentane, cyclohexane, methylcyclopentane and the like; and aromatic hydrocarbons such as benzene, toluene, xylene and the like, but it is not restricted to them. The copolymerization can be carried out by either method of a batch method and a continuous method.

The α-olefin which can be used for the polymerization, that is, can be polymerized includes, for example, ethylene, 1-butene, 3-methyl-1-butene, 1-pentene, 1-hexene, 4-methyl-1-pentene, 3-methyl-1-pentene, 1-octene, 1-decene, 1-dodecene, 1-tetradecene, 1-hexadecene, 1-octadecene, 1-eicocene and the like. The α-olefins can be used alone or in combination of two or more kinds thereof.

In carrying out the copolymerization by a batch method using the olefin polymerization catalyst, the metallocene compound in the polymerization system is used in a concentration of usually 0.00005 to 1 millimole, preferably 0.0001 to 0.50 millimole per 1 liter of the polymerization volume.

The reaction time (average residence time when carrying out the copolymerization by a continuous method) is varied according to the conditions such as a catalyst concentration, a polymerization temperature and the like, and it is usually 5 minutes to 3 hours, preferably 10 minutes to 1.5 hour.

Propylene and at least one olefin selected from α-olefins (excluding propylene) having 2 to 20 carbon atoms described above are supplied respectively to the polymerization system in such amounts that the propylene-based copolymer (B) having the specific composition described above is obtained. In the copolymerization, a molecular weight modifier such as hydrogen can be used as well.

When propylene is copolymerized with at least one olefin selected from α-olefins (excluding propylene) having 2 to 20 carbon atoms in the manner described above, the propylene-based copolymer (B) is usually obtained in the form of a polymerization solution containing it. This polymerization solution is processed by a conventional method, and the propylene-based copolymer (B) is obtained.

The copolymerization reaction is carried out usually on the conditions of a temperature falling in a range of 40 to 200° C., preferably 40 to 180° C. and further preferably 50 to 150° C. and a pressure falling in a range of exceeding 0 to 10 MPa, preferably 0.5 to 10 MPa and more preferably 0.5 to 7 MPa.

Preferred Form of the Propylene-Based Copolymer (B):

A propylene•butene•ethylene copolymer (B-1) and a propylene ethylene copolymer (B-2) each shown below can be used as the preferred form of the propylene-based copolymer (B).

(B-1) Propylene•Butene•Ethylene Copolymer:

The propylene•butene•ethylene copolymer (B-1) comprises 55 to 90 mole %, preferably 55 to 87 mole % of a structural unit derived from propylene, 3 to 43 mole %, preferably 10 to 30 mole % of a structural unit derived from 1-butene and 2 to 42 mole %, preferably 3 to 35 mole % of a structural unit derived from ethylene in the propylene-based copolymer (B) described above.

The propylene•butene•ethylene copolymer (B-1) having the composition described above has a good compatibility with the isotactic propylene-based polymer (A-1) described above.

(B-2) Propylene•Ethylene Copolymer:

The propylene•ethylene copolymer (B-2) comprises 55 to 90 mole %, preferably 60 to 85 mole % of a structural unit derived from propylene and 10 to 45 mole %, preferably 15 to 40 mole % of a structural unit derived from ethylene in the propylene-based copolymer (B) described above.

The propylene ethylene copolymer (B-2) having the composition described above has a good compatibility with the syndiotactic propylene-based polymer (A-2) described above.

[Thermoplastic Resin Composition for Sealing a Solar Cell and Sheet for Sealing a Solar Cell]

The sheet for sealing a solar cell of the present invention (hereinafter referred to merely as the sheet) is formed from the thermoplastic resin composition for sealing a solar cell (hereinafter referred to merely as the thermoplastic resin composition) comprising the propylene-based polymer (A) and the propylene-based copolymer (B) each described above in the following amounts:

propylene-based polymer (A): 0 to 70 parts by weight, preferably 10 to 50 parts by weight propylene-based copolymer (B): 30 to 100 parts by weight, preferably 50 to 90 parts by weight (in this case, the total amount of (A) and (B) is 100 parts by weight).

If the amounts of the propylene-based polymer (A) and the propylene-based copolymer (B) fall in the preferred ranges, it is preferred in the points that the sheet for sealing a solar cell is provided with a good moldability and that the sheet for sealing a solar cell obtained is improved in heat resistance, transparency and flexibility.

Capable of being given as the specific examples of the thermoplastic resin composition of the present invention for sealing a solar cell are:

a thermoplastic resin composition 1 comprising the isotactic propylene-based polymer (A-1) and the propylene•butene•ethylene copolymer (B-1), a thermoplastic resin composition 2 comprising the syndiotactic propylene-based polymer (A-2) and the propylene•ethylene copolymer (B-2) and a thermoplastic resin composition 3 comprising the syndiotactic propylene-based polymer (A-2) and the propylene•butene•ethylene copolymer (B-1).

The thermoplastic resin composition 3 is excellent particularly in both of heat resistance and transparency after thermal lamination.

The thermoplastic resin composition of the present invention for sealing a solar cell can be further blended with a coupling agent (X) as an adhesion promoter in order to enhance an adhesive property to glass, plastics and the like of the sheet of the present invention for sealing a solar cell formed from the above composition. The above coupling agent (X) can be used without any specific restrictions as long as it can enhance an adhesive property between a layer (that is, the sheet for sealing a solar cell) containing the thermoplastic resin composition of the present invention for sealing a solar cell and other layers containing a polar group-containing resin or an inorganic compound such as metal and the like in an amount of 50% by weight or more. The coupling agents of a silane base, a titanate base and a chromium base are preferably used, and particularly the coupling agents of a silane base (silane coupling agents) are suitably used.

Publicly known silane coupling agents can be used as the silane coupling agent and are not specifically be restricted, and capable of being used, to be specific, are vinyltriethoxysilane, vinyltrimethoxysilane, vinyltris(β-methoxy-ethoxysilane), γ-glycidoxypropyltrimethoxysilane, γ-aminopropyltriethoxysilane and the like. The blending amount of the silane coupling agent is 0.01 to 10 parts by weight, preferably 0.1 to 3 parts by weight based on total 100 parts by weight of the propylene-based polymer (A) and the propylene-based copolymer (B) each described above.

Further, the coupling agent can be subjected to graft reaction with the thermoplastic resin composition by subjecting the coupling agent and the thermoplastic resin composition to, for example, heat treatment such as melt kneading under the presence of organic peroxide.

The blending amount of the coupling agent is preferably about 0.1 to 5 parts by weight based on total 100 parts by weight of the propylene-based polymer (A) and the propylene-based copolymer (B) each described above. The sheet for sealing a solar cell formed from the thermoplastic resin composition subjected to silane grafting has an adhesive property to glass, plastics and the like which is equal to or more than that of the sheet for sealing a solar cell formed from the thermoplastic resin composition described above which is blended with the silane coupling agent.

Further, the thermoplastic resin composition of the present invention may be blended, if necessary, with the following radical reaction auxiliary agents.

To be specific, sulfur, p-quinonedioxime, p,p'-dibenzoylquinonedioxime, N-methyl-N-4-dinitrosoaniline, nitrosobenzene, diphenylguanidine, peroxy auxiliary agents such as trimethylolpropane-N,N'-m-phenylenedimaleimide, divinylbenzene, triallyl cyanurate (TAC) and triallyl isocyanurate (TAIC) are preferred as the radical reaction auxiliary agents from the viewpoint of a reaction efficiency. Further, they include multifunctional methacrylate monomers such as ethylene glycol dimethacrylate, diethylene glycol dimethacrylate, polyethylene glycol dimethacrylate, trimethylolpropane trimethacrylate, allyl methacrylate and the like and multifunctional vinyl monomers such as vinyl butyrate, vinyl stearate and the like.

Among them, triallyl cyanurate (TAC) and triallyl isocyanurate (TAIC) are preferred from the viewpoint of a reaction efficiency.

In the present invention, the auxiliary agents described above are used preferably in an amount of 1/30 to 20/1, preferably 1/20 to 10/1 in terms of a weight ratio [(auxiliary agent)/(organic peroxide)] of the auxiliary agent to organic peroxide described later. When using the organic peroxide, it is used preferably so that it does not get into a "cross-linked" state as describe below. The amount thereof is not specifically restricted, and an amount of, for example, the organic peroxide is preferably 0.001 to 5 parts by weight, more preferably 0.01 to 3 parts by weight based on total 100 parts by weight of (A) and (B).

The thermoplastic resin composition of the present invention and the sheet for sealing a solar cell prepared from the above composition may be cross-linked, but it is preferably not cross-linked, that is, non-cross-linked from the viewpoint of recycling the sheet.

In the present specification, the term "cross-linked" means that at least a part of the polymer contained in the thermoplastic resin composition or the sheet for sealing a solar cell is cross-linked and that a boiling xylene insoluble of the whole organic compounds contained in the above composition or the above sheet accounts for 0.1% by weight or less or a melt flow rate (MFR) measured at 230° C. and a load of 2.16 kg according to ASTM D 1238 is 0.04 g/10 minutes or less.

Publicly known peroxides can be used as the organic peroxide for grafting and are not specifically restricted, and they specifically include, dilauroyl peroxide, 1,1,3,3-tetramethylbutylperoxy-2-ethyl hexanoate, dibenzoyl peroxide, t-amylperoxy-2-ethyl hexanoate, t-butylperoxy-2-ethyl hexanoate, t-butylperoxy isobutylate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy normal octoate, 1,1-di(t-butylperoxy)-3,3,5-trimethylcyclohexane, 1,1,-di(t-butylperoxy)cyclohexane, t-butylperoxy isopropyl carbonate, t-butylperoxy-2-ethylhexyl carbonate, 2,5-dimethyl-2,5-di(benzoylperoxy)hexane, t-amyl-peroxy benzoate, t-butylperoxy acetate, t-butylperoxy isononanoate, t-butylperoxy benzoate, 2,2-di(butylperoxy)butane, n-butyl-4-4-di(t-butylperoxy)butylate, methyl ethyl ketone peroxide, ethyl-3,3-di(t-butylperoxy)butylate, dicumyl peroxide, t-butylcumyl peroxide, di-t-butyl peroxide, 1,1,3,3-tetramethylbutyl hydroperoxide, acetylacetone peroxide and the like.

Further, the thermoplastic resin composition of the present invention and the sheet for sealing a solar cell formed from the above composition may be blended with other various additives as long as the object of the present invention is not damaged. Such additives include, for example, UV absorbers for preventing the sheet for sealing a solar cell from being deteriorated by a UV ray in a sunlight, light stabilizing agents, antioxidants, heat resistant stabilizing agents, antistatic agents, slipping inhibitors, antiblocking agents, antifog additives, transparent nucleating agents, lubricants, pigments, dyes, plasticizers, age resistors, hydrochloric acid absorbing agents and the like.

Used as the UV absorbers are, specifically, UV absorbers of a benzophenone base such as 2-hydroxy-4-methoxybenzophenone, 2,2-dihydroxy-4-methoxybenzophenone, 2-hydroxy-4-methoxy-4-carboxybenzophenone, 2-hydroxy-4-N-octoxybenzophenone and the like; a benzotriazole base such as 2-(2-hydroxy-3,5-di-t-butylphenyl)benzotriazole, 2-(2-hydroxy-5-methylphenyl)benzotriazole and the like; and a salicylic ester base such as phenyl salicylate, p-octylphenyl salicylate and the like.

Light stabilizing agents of a hindered amine base are used as the light stabilizing agents.

Antioxidants of a hindered phenol base and a phosphite base are used as the antioxidants.

The melt flow rate (MFR) of the thermoplastic resin composition of the present invention for sealing a solar cell measured at 230° C. and a load of 2.16 kg according to ASTM D 1238 is usually 0.05 to 1000 g/10 minutes, preferably 0.2 to 600 g/10 minutes and further preferably 0.3 to 200 g/10 minutes.

The thermoplastic resin composition of the present invention for sealing a solar cell has a maximum peak of a melting point (Tm, ° C.) at 100° C. or higher in an endothermic curve in differential scanning calorimetry (DSC), and a heat of fusion thereof falls in a range of preferably 1 to 40 J/g, more preferably 3 to 35 J/g.

The thermoplastic resin composition of the present invention for sealing a solar cell has a maximum endothermic peak (melting point) of 100° C. or higher, preferably 110° C. or higher and more preferably 120° C. or higher.

The thermoplastic resin composition of the present invention for sealing a solar cell may be blended with other resins, rubbers, inorganic fillers and the like as long as the object[s] of the present invention is not damaged. In particular, it is blended preferably with a petroleum resin since the thermoplastic resin composition for sealing a solar cell is improved in a stress absorbing property in the vicinity of room temperature.

The thickness of the sheet of the present invention for sealing a solar cell [shall] is not specifically restricted, and it falls preferably in a range of usually 0.1 to 3 mm. If it is smaller than 0.1 mm, glass and a solar cell are liable to be broken in a thermal laminating step in producing the solar cell, and if it is larger than 3 mm, the above sheet is reduced in a light transmission factor to result in a reduction in an optically generated electricity in a certain case.

The sheet of the present invention for sealing a solar cell can be produced, though not specifically restricted, by molding the thermoplastic resin composition of the present invention for sealing a solar cell by publicly known extrusion molding (cast molding, extrusion sheet molding, inflation molding, injection molding and the like), compression molding, calendar molding and the like.

Further, the sheet is subjected preferably to emboss processing from the viewpoint that blocking between the sheets is prevented and that embossing acts as a cushion toward glass and a solar cell element (a power module) in laminating to prevent them from being broken.

A layer comprising a thermoplastic resin other than the thermoplastic resin composition of the present invention for sealing a solar cell may be laminated on one face or both faces of the sheet of the present invention for sealing a solar cell.

The sheet of the present invention for sealing a solar cell is laminated on one face and/or both faces of a solar cell element, and a surface protective layer is further laminated, if necessary, on a surface of the laminated sheet for sealing a solar cell which is reverse to a solar cell element side, whereby it can be used for a solar cell. One example of a form of a solar cell in which the sheet for sealing a solar cell is applied is shown in FIG. 1.

A process for producing the solar cell is not specifically restricted and includes, for example, a process in which a surface protective layer, a solar cell element and the sheet of the present invention for sealing a solar cell are laminated in a desired order and in which they are then thermally laminated under vacuum aspiration.

The surface protective layer described above is not specifically restricted as long as it can protect the solar cell and a layer comprising the sheet for sealing a solar cell and does not damage the objects of the present invention. Publicly known materials can be used as the surface protective layer. The specific examples of materials for the surface proteCtive layer include glass, polyethylene resins, polypropylene resins, cyclic polyolefin resins, AS (acrylonitrile-styrene) resins, ABS (acrylonitrile-butadiene-styrene) resins, polyvinyl chloride resins, fluorinated resins, polyester resins such as polyethylene terephthalate, polyethylene naphthalate and the like, phenol resins, polyacryl base resins, polyamide resins such as various nylons and the like, polyimide resins, polyamide-imide resins, polyurethane resins, cellulose base resins, silicone base resins, polycarbonate resins and the like. The above resins which are mixed (blended) may be used or different resins may be laminated, and different resins which are laminated are preferably used.

An inorganic/organic composite film on which inorganic oxides and the like are deposited can also be preferably used as the surface protective layer described above in order to enhance a barrier property against gas and moisture.

A layer comprising a publicly known adhesive or an adhesive resin may be provided between the surface protective layer and the sheet (layer) of the present invention for sealing a solar cell or when the surface protective layer is a laminated layer comprising plural layers, between these layers in order to enhance an adhesive strength between the above layers. Further, one of the two surface protective layers described above may have a light shielding property or a light reflecting property according to the embodiment of the solar cell of the present invention. In this case, when the surface protective layer is a laminated layer comprising plural layers, at least one of these layers may have a light shielding property or a light reflecting property. A method for providing a certain layer with a light shielding property includes, for example, a method in which the above layer is formed from a resin prepared by blending and kneading a pigment (for example, titan white and like).

When the surface protective layer is a multilayer, it includes a method in which one of the above layers is formed from a resin prepared by blending and kneading a pigment (for example, titan white and like).

Further, one of the surface protective layers may be a layer comprising a metal foil, for example, an aluminum foil.

EXAMPLES

The present invention is explained below in further detail [s] with reference to examples.

Raw Materials

Catalyst Synthetic Example 1

Synthesis of dibenzylmethylene(cyclopentadienyl)(3, 6-di-tert-butylfluorenyl)zirconium dichloride Produced by a method described in Synthetic Example 3 of Japanese Patent Application Laid-Open No. 2004-189666.

Catalyst Synthetic Example 2

Synthesis of di(p-chlorophenyl)methylene(cyclopentadienyl)-(octamethyloctahydrodibenzofluorenyl) zirconium dichloride (i) Synthesis of 6,6-di(p-chlorophenyl)fulvene A reaction vessel equipped with a dropping funnel was charged with 40 ml of dehydrated tetrahydrofuran and 2.15 ml (25.9 mmol) of cyclopentadiene under nitrogen atmosphere, and 18.0 ml (28.5 mmol) of a hexane solution of n-butyllithium of 1.58 mol/L was added dropwise and stirred while cooling the above solution at 0° C. Then, a solution prepared by dissolving 5.00 g (19.9 mmol) of 4,4'-dichlorobenzophenone in 30 ml of dehydrated tetrahydrofuran was placed in the dropping funnel and added dropwise while cooling at 0° C., and the solution was allowed to return to room temperature and stirred for one day. This reaction solution was extracted with diethyl ether, and the separated organic layer was washed with 1N hydrochloric acid, a saturated sodium hydrogen carbonate aqueous solution and a saturated salt solution and dried over anhydrous magnesium sulfate. Then, magnesium sulfate was removed by filtration, and the solvent contained in the filtrate was removed by distillation under reduced pressure by means of a rotary evaporator. The residue was purified through a silica gel column to obtain a targeted product (amount obtained: 3.37 g, yield: 57%). The targeted product was identified by means of $^1$H-NMR.

$^1$H-NMR spectrum (270 MHz, CDCl$_3$, TMS): d/ppm 6.21 to 6.24 (m, 2H), 6.60 to 6.63 (m, 2H), 7.23 (d, 2H, J=8.1 Hz), 7.37 (d, 2H, J=8.6 Hz).

(ii) Synthesis of di(p-chlorophenyl)cyclopentadienyl-(octamethyloctahydrodibenzofluorenyl)methane A reaction vessel equipped with a dropping funnel was charged with 40 ml of dehydrated tetrahydrofuran and 2.35 g (6.08 mmol) of octamethyloctahydrodibenzofluorene synthesized by a method described in (i) of Synthetic Example 1 under nitrogen atmosphere, and 4.62 ml (7.30 mmol) of a hexane solution of n-butyllithium of 1.58 mol/L was added dropwise and stirred while cooling the above solution at 0° C. 1,3-Dimethyl-2-imidazolidinone 0.86 ml (7.90 mmol) was added to the above solution and stirred for 30 minutes. Then, a solution prepared by dissolving 2.00 g (6.68 mmol) of 6,6-di(p-chlorophenyl)fulvene in 30 ml of dehydrated tetrahydrofuran was [put] placed in the dropping funnel and added dropwise while cooling at −78° C., and the solution was stirred for one day while slowly allowing it to return to room temperature. This reaction solution was extracted with diethyl ether, and the separated organic layer was washed with 1N hydrochloric acid, a saturated sodium hydrogen carbonate aqueous solution and a saturated salt solution and dried over anhydrous magnesium sulfate. Then, magnesium sulfate was removed by filtration, and the solvent contained in the filtrate was removed by distillation under reduced pressure by means of a rotary evaporator. The residue was purified through a silica gel column and then recrystallized from toluene to obtain a targeted product (amount obtained: 0.714 g, yield: 17%). The targeted product was identified by means of $^1$H-NMR and FD-MS spectra.

$^1$H-NMR spectrum (270 MHz, CDCl$_3$, TMS): d/ppm 0.94 (s, 6H), 1.14 (s, 6H), 1.27 (s, 12H), 1.62 (s, 8H), 3.06 (b, 2H), 5.30 (s, 1H), 6.38 to 6.50 (b, 3H), 7.00 to 7.29 (m, 8H) FD-MS spectrum: m/z 684 (M$^+$).

(iii) Synthesis of di(p-chlorophenyl)methylene-(cyclopentadienyl)(octamethyloctahydrodibenzofluorenyl)-zirconium dichloride Di(p-chlorophenyl)cyclopentadienyl-(octamethyloctahydrodibenzofluorenyl)methane 42.8 mg (0.62 mmol) was added to 15 ml of dehydrated diethyl ether under nitrogen atmosphere, and 0.87 ml (1.37 mmol) of a hexane solution of n-butyllithium of 1.58 mol/L was added dropwise and stirred for one night while cooling the above solution at 0° C. Then, 224 mg (0.59 mmol) of a zirconium tetrachloride•tetrahydrofuran complex (1:2) was added thereto while cooling at −78° C. and stirred for one night. The volatile matter in this slurry was removed by distillation under reduced pressure, and then the residue was washed with 40 ml of dehydrated hexane to remove the washing liquid by filtration. The hexane soluble part of the filtrate was concentrated, and dehydrated hexane was added to a deposited solid matter to recrystallize it, whereby the targeted product was obtained (amount obtained: 90 mg, yield: 18%). The targeted product was identified by means of $^1$H-NMR and FD-MS spectra.

$^1$H-NMR spectrum (270 MHz, CDCl$_3$, TMS): d/ppm 0.87 (s, 6H), 0.99 (s, 6H), 1.42 (s, 6H), 1.49 (s, 6H), 1.64 to 1.71 (m, 8H), 5.51 to 5.53 (m, 2H), 6.17 (s, 2H), 6.29 to 6.31 (m, 2H), 7.33 (dd, 2H, J=2.16 Hz, 8.37 Hz), 7.46 (dd, 2H, J=1.89 Hz, 8.64 Hz), 7.74 (dd, 2H, J=2.43 Hz, 8.1 Hz), 7.88 (dd, 2H, J=2.16 Hz, 8.37 Hz), 8.08 (s, 2H)

FD-MS spectrum: m/z 844 (M$^+$).

Catalyst Synthetic Example 3

Synthesis of dimethylmethylene(3-tert-butyl-5-methylcyclopentadienyl)fluorenylzirconium dichloride Produced by a method described in Example 1 of an International Publication No. 2001/27124 pamphlet.
[Components of the Composition]
(a-1) Isotactic Polypropylene (iPP):
Isotactic polypropylene (a-1) used had the following physical properties; ethylene content=3.0 mole %, 1-butene content=1.0 mole %, MFR (230° C.)=7 g/10 minutes, melting point=140° C., mmmm fraction=98%, Mw/Mn=4.8.
(a-2) Syndiotactic Polypropylene (sPP):
Syndiotactic polypropylene (a-2) used had the following physical properties; propylene content=99.9 mole % or more, MFR (230° C.)=2.0 g/10 minutes, melting point (low temperature side/high temperature side)=152° C./158° C., Mw/Mn=2.0, density=881 kg/m$^3$, rrrr fraction=94%.
[Production Process of sPP (a-2)]

A reaction vessel having an inner volume of 3 m$^3$ which was sufficiently purged with nitrogen was charged with 1000 L of n-heptane, and 610 ml (0.93 mole) of a toluene solution (Al=1.53 mol/L) of methylaluminoxane was dropwise added thereto at ambient temperature. A magnetic stirrer was put in a side-arm flask having an inner volume of 5 L which was sufficiently purged with nitrogen, and 610 ml (0.93 mole) of a toluene solution (Al=1.53 mlo/L) of methylaluminoxane and then a toluene solution of 1.30 g (1.86 mmol) of dibenzylmethylene(cyclopentadienyl)(3,6-di-tert-butylfluorenyl) zirconium dichloride were added thereto and stirred for 20 minutes. This solution was added to the reaction vessel described above, and then 3200 NL of hydrogen was supplied at 19 Nm$^3$/hour in 10 minutes. Then, polymerization was initiated while supplying propylene at 65 kg/hour and hydrogen so that a gas phase concentration thereof in the reaction vessel was 57 mol % (the total of propylene and hydrogen in a gas phase was set to 100 mol %). Propylene was supplied continuously at a rate of 65 kg/hour while maintaining a gas phase concentration of hydrogen in the reaction vessel at 57 mol % to carry out polymerization at 25° C. for 4 hours, and then a small amount of diethylene glycol monoisopropyl ether was added to terminate the polymerization. The resulting polymer was washed with 1.8 m$^3$ of heptane and dried at 80° C. for 15 hours under reduced pressure to obtain 100 kg of a polymer.
(b-1) Propylene•Butene•Ethylene Copolymer*(PBER):
The propylene•butene•ethylene copolymer (b-1) used had the following physical properties;
ethylene content=10 mole %, 1-butene content=28 mole %, Tm=not observed, MFR (230° C.)=1.2 g/10 minutes, density=853 kg/m$^3$.
[Production Process of PBER (b-1)]

A polymerization reactor of 2000 ml which was sufficiently purged with nitrogen was charged with 833 ml of dried hexane, 120 g of 1-butene and triisobutylaluminum (1.0 mmol) at ambient temperature. Then, the inside of the polymerization reactor was heated to 65° C., and pressure was applied by propylene so that the inside pressure of the system was 0.33 MPa. Thereafter, the inside pressure of the system was controlled to 0.62 MPa by ethylene. Next, di(p-chlorophenyl)-methylene(cyclopentadienyl)(octamethyloctahydrodibenzo-fluorenyl)zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount containing 0.002 mmol of zirconium atom (accordingly, an amount containing 0.6 mmol of aluminum atom) and added to the polymerization reactor. They were polymerized at an inside temperature of 65° C. for 20 minutes while maintaining the inside pressure of the system at 0.62 MPa by ethylene, and 20 ml of methanol was added to terminate the polymerization. After releasing the pressure, the polymer was deposited from the polymerization solution in 2 L of methanol, and the polymer was dried at 130° C. for 12 hours under vacuum. The polymer thus obtained had a weight of 73 g.

(b-2) Propylene•Ethylene Copolymer (PER):

A syndiotactic propylene•ethylene copolymer (b-2) used had the following physical properties;
ethylene content=18 mole %, Tm=not observed, MFR (230° C.)=0.9 g/10 minutes, density=853 kg/m³, rr fraction=84%.

[Production Process of PER (b-2)]

A polymerization reactor of 4000 ml which was sufficiently purged with nitrogen was charged with 1834 ml of dried hexane and triisobutylaluminum (1.0 mmol) at ambient temperature. Then, [an] the inside of the polymerization reactor was heated to 85° C., and pressure was applied by propylene so that the inside pressure of the system was 0.67 MPa. Thereafter, the inside pressure of the system was controlled to 1.37 MPa by ethylene. Next, di(p-chlorophenyl)methylene-(cyclopentadienyl)(octamethyloctahydrodibenzofluorenyl)-zirconium dichloride was mixed with a toluene solution of methylaluminoxane (manufactured by Tosoh Finechem Corporation) to prepare a toluene solution containing an aluminum atom and a zirconium atom in a proportion of aluminum atom/zirconium atom=300/1 (mole ratio), and then the above toluene solution was taken in an amount containing 0.001 mmol of a zirconium atom (accordingly, an amount containing 0.3 mmol of an aluminum atom) and added to the polymerization reactor. They were polymerized at an inside temperature of 85° C. for 10 minutes while maintaining the inside pressure of the system at 1.37 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 90 g.

(C) Propylene Polymer (iPBER):

Used was a propylene•ethylene•1-butene random copolymer (MFR=7.2 g/10 minutes, Tm=not observed, ethylene content=14 mole %, 1-butene content=19 mole %, Mw/Mn=2.0, shore A hardness=45, mm fraction=92%).
(An isotactic triad fraction (mm fraction) can be measured by using a method described on a 7th line at page 21 to a 6th line at page 26 in an International Publication No. 2004-087775 pamphlet)

[Production Process of iPBER (C)]

A polymerization reactor of 2000 ml which was sufficiently purged with nitrogen was charged with 917 ml of dried hexane, 85 g of 1-butene and triisobutylaluminum (1.0 mmol) at ambient temperature. Then, an inside of the polymerization reactor was heated to 65° C., and pressure was applied by propylene so that the inside pressure of the system was 0.77 MPa. Thereafter, the inside pressure of the system was controlled to 0.78 MPa by ethylene. Next, dimethylmethylene(3-tert-butyl-5-methylcyclopentadienyl)fluorenylzirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.002 mmol of a zirconium atom was contained (accordingly, an amount in which 0.6 mmol of an aluminum atom was contained) and added to the polymerization reactor. They were polymerized at an inside temperature of 65° C. for 20 minutes while maintaining the inside pressure of the system at 0.78 MPa by ethylene, and 20 ml of methanol was added to terminate the polymerization. After releasing the pressure, the polymer was deposited from the polymerization solution in 2 L of methanol, and the polymer was dried at 130° C. for 12 hours under vacuum. The polymer thus obtained had a weight of 60.4 g.

(D) Ethylene•Vinyl Acetate Copolymer (EVA):

EVA used had the following physical properties;
density=950 kg/m³, vinyl acetate content=28 wt %, MFR (190° C.)=15 g/10 minutes, melting point=71° C.

(X) Silane Coupling Agent:

3-Methacryloxypropyltrimethoxysilane (VMMS) (trade name: SZ-6030, manufactured by Dow Corning Toray Co., Ltd.) was used as the silane coupling agent (X).

(Y) Organic Peroxide:

Dialkyl type peroxide (trade name: PERHEXA 25B (PH25B), manufactured by NOF Corporation) was used as the organic peroxide (Y).

TABLE 1

|  |  |  | Propylene-based polymer (A) | | Propylene-based copolymer (B) | |
| --- | --- | --- | --- | --- | --- | --- |
|  |  |  | (a-1) | (a-2) | (b-1) | (b-2) |
| Composition | (a) Propylene content | (mole %) | 96 | 100 | 62 | 82 |
|  | (b) Ethylene content | (mole %) | 3 | 0 | 10 | 18 |
|  | (c) α-olefin content | (mole %) | 1 | 0 | 28 | 0 |
| Melting point (Tm) |  | (° C.) | 140 | 152/158 | Not observed | Not observed |
| mmmm |  | (%) | 98 | — | — | — |
| rr |  | (%) | — | — | — | 84 |
| rrrr |  | (%) | — | 94 | — | — |
| [η] |  |  | 1.9 | 1.8 | 2.1 | 2.3 |
| MFR |  | (g/10 minutes) | 7.0 | 2.0 | 1.2 | 0.9 |
| Density |  | (g/cm³) | — | 0.881 | 0.853 | 0.853 |
| Mw/Mn |  |  | 4.8 | 2.0 | 2.0 | 2.0 |

(Z) Auxiliary Agent:

Triallyl isocyanurate (trade name: M-60, manufactured by Nippon Kasei Chemical Co., Ltd., TAIC content 60%) was used as the auxiliary agent (Z).

[Methods for Measuring Physical Properties of the Raw Materials Described Above]

(1) Comonomer (ethylene, 1-butene) content, stereoregularity (mm fraction, rr fraction, rrrr fraction):

Determined by analysis of a $^{13}$C-NMR spectrum.

(2) MFR:

MFR at 190° C. or 230° C. and a load of 2.16 kg was measured according to ASTM D-1238.

(3) Melting Point:

An exothermic•endothermic curve in DSC was determined, and a temperature in a maximum melt peak position in heating was set as Tm. In measurement, a sample was filled in an aluminum pan, and (i) it was heated up to 200° C. at 100° C./minute and held at 200° C. for 5 minutes; then, (ii) it was cooled down to −150° C. at 10° C./minute; and next, (iii) it was heated up to 200° C. at 10° C./minute. A temperature of an endothermic peak observed in above (iii) is a melting point (Tm).

In a measurement obtained by heating, a sample was filled in an aluminum pan and heated up to 200° C. at 100° C./minute; it was held at 200° C. for 5 minutes; then it was cooled down to −150° C. at 10° C./minute; and next, the melting point was determined from an exothermic endothermic curve in heating it at 10° C./minute.

(4) Molecular Weight Distribution (Mw/Mn):

The molecular weight distribution (Mw/Mn) was measured (in terms of polystyrene, Mw: weight average molecular weight, Mn: number average molecular weight) at a column temperature of 140° C. with use of GPC (gel permeation chromatography), wherein orthodichlorobenzene was used as a solvent (mobile phase). Specifically, the molecular weight distribution (Mw/Mn) was measured in the following manner by means of a gel permeation chromatograph Alliance GPC-2000 manufactured by Waters Corporation. Separating columns: two columns of TSKgel GNH6-HT and two columns of TSKgel GNH6-HTL, each having a column size: a diameter of 7.5 mm and a length of 300 mm; a column temperature: 140° C.; o-dichlorobenzene (manufactured by Wako Pure Chemical Industries, Ltd.) was used for a mobile phase, and 0.025% by weight of BHT (manufactured by Takeda Pharmaceutical Co., Ltd.) was used as an antioxidant; they were moved at 1.0 ml/minute; a sample concentration was set to 15 mg/10 ml; a sample injection amount was set to 500 microliter; a differential refractometer was used as a detector. A product manufactured by Tosoh Corp. was used as standard polystyrene for a molecular weight of Mw<1000 and Mw>4×10$^6$, and a product manufactured by Pressure Chemical Co., Ltd. was used for a molecular weight of 1000≦Mw≦4×10$^6$.

(5) Density:

The density was measured according to a method described in ASTM D1505.

Example 1

VMMS 0.5 part by weight, PH25B 0.09 part by weight and M-60 0.02 part by weight were kneaded (190° C., 3 minutes, 40 rpm) with total 100 parts by weight of iPP (a-1) 20 parts by weight and PBER (b-1) 80 parts by weight by means of a lab plastomill (manufactured by Toyo Seiki Seisaku-sho, Ltd.) to obtain a thermoplastic resin composition.

The above thermoplastic resin composition was processed by means of a press molding machine (heated at 190° C. for 7 minutes and then cooled) to prepare a pressed sheet (sealing sheet sample) having a thickness of 500 μm and a pressed sheet (for evaluating MFR, flexibility, heat resistance and stress absorbing property) having a thickness of 2 mm as a sheet for sealing a solar cell.

The above pressed sheet having a thickness of 2 mm was used as a test piece to evaluate a sheet for sealing a solar cell by a method described later. The results thereof are shown in Table 2.

Figure 2:
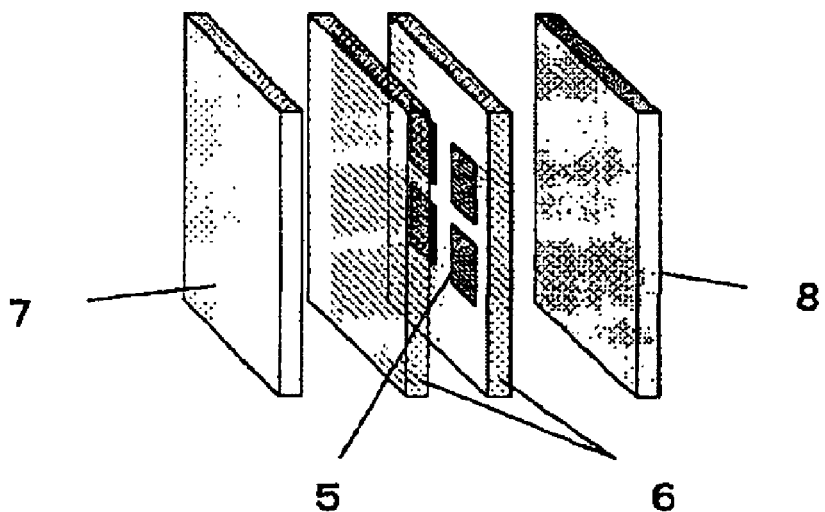
FIG. 2 is a schematic drawing of a sample for a heat resistance test and a glass adhesion test as described in the examples (for the sake of convenience, the respective layers are drawn apart from each other).

As shown in FIG. 2, an aluminum plate having a thickness of 300 μm which was used as a pseudo module was interposed between two sheets of the sealing sheet sample described above. Further, a glass plate (white plate thermally treated glass, manufactured by Asahi Glass Kinki Kenzai K. K.) having a thickness of 3 mm was superposed on one surface of the sealing sheet, and a white PET film (Lumirror (registered trade name) (S10 type), manufactured by Toray Industries, Inc.) having a thickness of 50 μm was superposed on the other surface of the sealing sheet. They were thermally laminated under the conditions of 160° C., 10 minutes and 1 atmospheric pressure to prepare a sample for a heat resistance test and a sample for a glass adhesiveness test.

Figure 3:
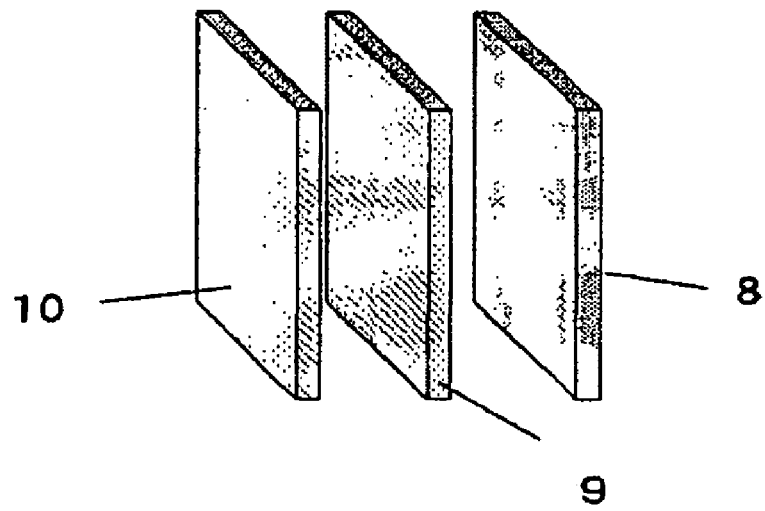
FIG. 3 is a schematic drawing of a sample for a transparency test and appearance evaluation as described in the examples (for the sake of convenience, the respective layers are drawn apart from each other).

Further, as shown in FIG. 3, glass having a thickness of 3 mm, the sealing sheet sample described above and a transparent PET film (Lumirror (registered trade name) (E60 type), manufactured by Toray Industries, Inc.) having a thickness of 50 μm were superposed in this order, and they were thermally laminated under the conditions of 150° C., 10 minutes and 1 atmospheric pressure to prepare a sample for a transparency test.

Further, a sample for evaluating an appearance was prepared by the same method as the method for preparing the sample for a transparency test, except that the temperature in thermal lamination was changed to 160° C.

The above samples for various tests were used to evaluate a sheet for sealing a solar cell by the following methods. The results thereof are shown in Table 2.

(Evaluation Methods)

1. MFR:

The pressed sheet having a thickness of 2 mm described above was used as a test piece to measure MFR at 190° C. or 230° C. and a load of 2.16 kg according to ASTM D-1238.

2. Transparency (Trans):

The sample for a transparency test described above was used as a test piece to measure a transparency by means of a digital turbidity meter NDH-2000 manufactured by Nippon Denshoku Industries Co., Ltd. The trans value was calculated according to the following equation.

Trans (%)=100×(whole transmitted light amount)/ (incident light amount)

3. Appearance (Presence of Cloudiness):

The sample for evaluating an appearance described above was used as a test piece to visually observe the presence of cloudiness in the sheet for sealing a solar cell. The evaluation criteria are shown below ○: no cloudiness Δ: a little cloudiness observed x: cloudiness observed 4. Heat Resistance (TMA):

The sheet sample having a thickness of 2 mm described above was used as a test piece to apply a pressure of 2 kgf/cm$^2$ onto a flat indenter of 1.8 mmφ while heating at a heating rate of 5° C./minute to determine a needle penetrating temperature (° C.) from a TMA curve.

5. Heat Resistance (Presence of Pseudo Module Fluidity):

The sample for a heat resistance test described above was held in a gradient state of 60° against a horizontal level for 1000 hours in an oven of 90° C. to evaluate the presence of fluidity of the pseudo module.

6. Adhesive Property with Glass (Adhesive Strength):

The sample for a glass adhesiveness test described above was used as a test piece to evaluate an adhesive strength (N/m) of the thermoplastic resin (sheet for sealing a solar cell) with glass.

Peeling test conditions: a peeling speed=300 mm/minute, a peeling method=180° peeling (according to a method described in JIS-K-6854).

7. Flexibility (Shore A Hardness):

The pressed sheet having a thickness of 2 mm described above was used as a test piece and left standing at room temperature for 48 hours, and then a scale was read immediately after brought into contact with a press needle by means of an A type measuring device (according to ASTM D-2240).

8. Stress Adsorbing Property (Impact Resilience):

Four sheets of the pressed sheets having a thickness of 2 mm described above were superposed, and an iron ball of 16 g was allowed to fall thereon from a height of 50 cm ($=L_0$). Then, a bounding height ($=L$) of the iron ball was measured at 23° C. to determine impact resilience according to the following equation.

Impact resilience (%)=$L/L_0 \times 100$

The evaluation results thereof are shown in Table 2.

Example 2

A thermoplastic resin composition was prepared by the same method as in Example 1, except that iPP (a-1) and PBER (b-1) were changed to 20 parts by weight of sPP (a-2) and 80 parts by weight of PER (b-2) to prepare a pressed sheet and samples for various tests, and the sheet for sealing a solar cell was evaluated. The results of the evaluations are shown in Table 2.

Example 3

A thermoplastic resin composition was prepared by the same method as in Example 1, except that 20 parts by weight of iPP (a-1) was changed to 20 parts by weight of sPP (a-2) to prepare a pressed sheet and samples for various tests, and the sheet for sealing a solar cell was evaluated. The results of the evaluations are shown in Table 2.

Reference Example 1

A thermoplastic resin composition was prepared by the same method as in Example 1, except that 80 parts by weight of PBER (b-1) was changed to 80 parts by weight of iPBER (C) to prepare a pressed sheet and samples for various tests, and the sheet for sealing a solar cell was evaluated.

The results of the evaluations are shown in Table 2.

Comparative Example 1

EVA 100 parts by weight, VMMS 0.5 part by weight, PH25B 0.09 part by weight and M-60 0.02 part by weight were kneaded (110° C., 3 minutes, 40 rpm) by means of a lab plastomill (manufactured by Toyo Seiki Seisaku-sho, Ltd.) to obtain a thermoplastic resin composition.

The above thermoplastic resin composition was processed by means of a press molding machine (heated at 160° C. for 10 minutes and then cooled) to prepare a pressed sheet (for evaluating MFR, flexibility and stress absorbing property) having a thickness of 2 mm, and it was evaluated by the same method as in Example 1. The evaluation results thereof are shown in Table 2.

Further, the above thermoplastic resin composition was processed by means of a press molding machine (heated at 140° C. for 10 minutes and then cooled) to prepare a pressed sheet (sealing sheet sample) having a thickness of 500 μm. Sample's for various tests were prepared by the same method as in Example 1, except that the above sealing sheet sample was used, and the sheet for sealing a solar cell was evaluated by the same method as in Example 1. The evaluation results thereof are shown in Table 2.

TABLE 2

| | | | Example 1 | Example 2 | Example 3 | Reference Example 1 | Comparative Example 1 |
|---|---|---|---|---|---|---|---|
| a-1 | iPP | weight part | 20 | | | 20 | |
| a-2 | sPP | weight part | | 20 | 20 | | |
| b-1 | PBER | weight part | 80 | | 80 | | |
| b-2 | PER | weight part | | 80 | | | |
| C | iPBER | weight part | | | | 80 | |
| D | EVA | weight part | | | | | 100 |
| X | VMMS | weight part | | | | 0.5 | |
| Y | PH-25B | weight part | | | | 0.09 | |
| Z | TAIC | weight part | | | | 0.02 | |
| Presence of cross-linking | MFR (230° C.) | g/10 minutes | 24 | 28 | 25 | 23 | Not flow |
| Transparency | Trans (150° C. lami) | % | 83 | 84 | 87 | 76 | 86 |
| | Trans (160° C. lami) | % | 85 | 86 | 86 | 85 | 86 |
| Appearance | Presence of cloudiness (150° C. lami) | | Δ | ○ | ○ | X | ○ |
| | Presence of cloudiness (160° C. lami) | | ○ | ○ | ○ | ○ | ○ |
| Heat resistance | TMA | ° C. | 119 | 123 | 125 | 120 | 60 |
| | Presence of pseudo module fluidity | | None | None | None | None | None |
| Adhesive property | Adhesive strength | N/m | 18 | 17 | 18 | 18 | 14 |
| Flexibility | Shore A | | 76 | 84 | 86 | 76 | 77 |
| Stress absorbing property | Impact resilience | % | 12 | 12 | 8 | 25 | 39 |

Figure 4:
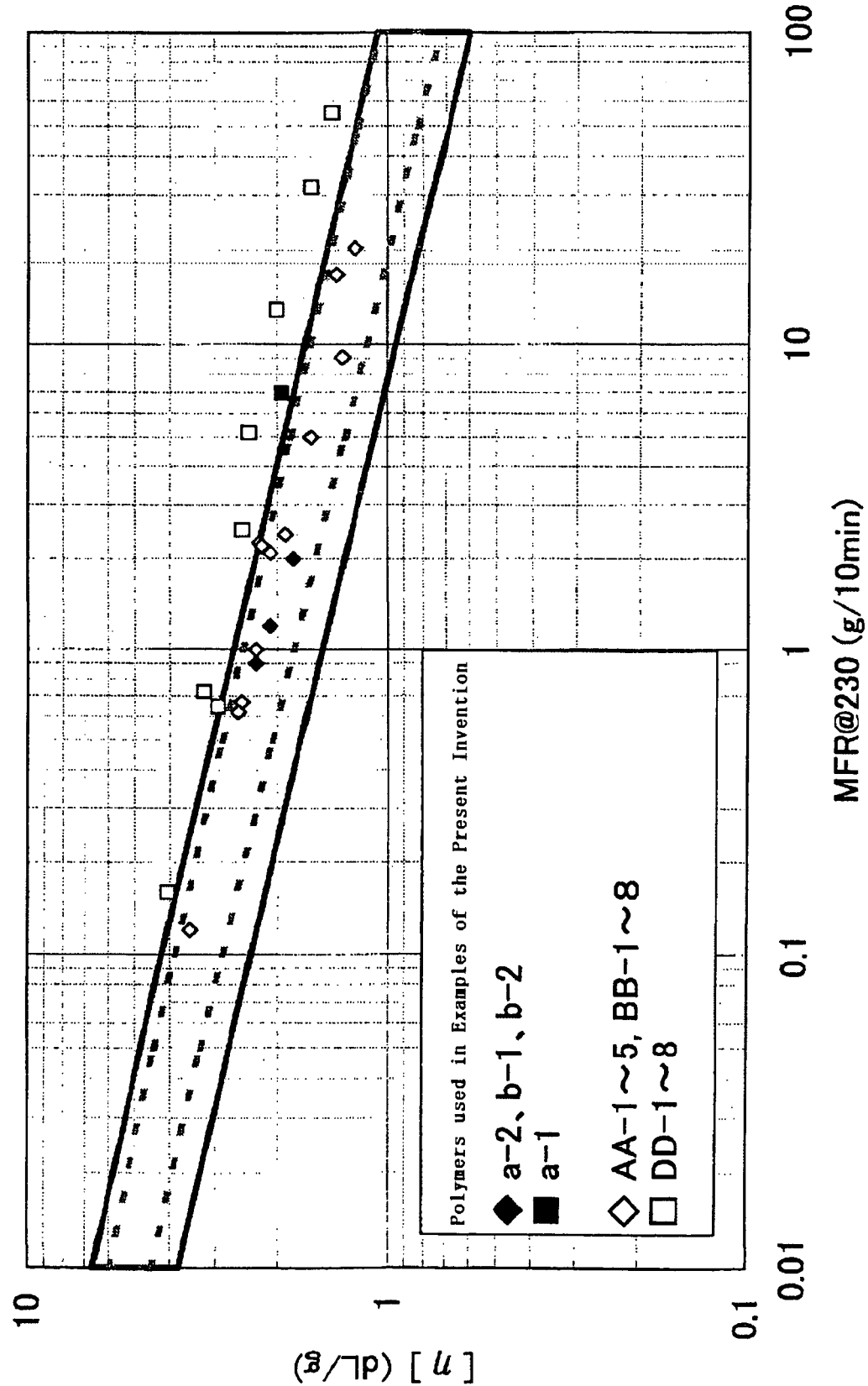
FIG. 4 is a diagram obtained by plotting MFR and [η] of a polymer corresponding to the component (A) or the component (B) used in the present invention and an isotactic propylene-based polymer. The part surrounded by heavy lines shows a region prescribed by the requisite (b-2) which is one of the preferred properties of the component (B) used in the present invention, and the part surrounded by broken lines shows a preferred range of (b-2).

Also, shown in FIG. 4 is a relation between MFR and [η] of iPP (a-1), sPP (a-2), PBER (b-1) and PER (b-2) each described above and the following polymers (AA-1) to (AA-5), (BB-1) to (BB-8) and isotactic polymers (DD-1) to (DD-8). It can be found that the isotactic polymers and the polymer used in the present invention are distinguished by the requisite (b-2).

Catalyst Synthetic Example 4

Synthesis of diphenylmethylene(3-tert-butyl-5-ethyl-cyclopentadienyl)(2,7-di-tert-butylfluorenyl)zirconium dichloride (i) Synthesis of 1-ethyl-3-tert-butylcyclopentadiene A 300 ml three neck flask equipped with a magnetic stirrer and a three-way cock was charged with 200 ml of diethyl ether and 52 ml (154 mmol) of a diethyl ether solution of 3.0-Methylmagnesium bromide under nitrogen atmosphere. 3-tert-Butylcyclopentenone 17.8 g (129 mmol) was added dropwise in one hour on an ice and water bath. The solution was stirred at room temperature for 20 hours, and then the reaction solution was poured into 100 ml of 2N hydrochloric acid. The organic layer was separated, and the aqueous layer was extracted twice with 50 ml of ether. The organic layers thus obtained were combined and washed twice with a saturated sodium hydrogen carbonate aqueous solution, twice with water and twice with a saturated salt solution. The organic layer was dried on magnesium sulfate, and the solvent was removed by distillation. Then, the residue was purified by column chromatography to obtain 20.2 g (GC purity: 75%) of a pale yellow transparent liquid. The yield was 78%. The product was identified by means of a $^1$H-NMR spectrum. The measurement results thereof are shown below.

$^1$H-NMR spectrum (270 MHz, CDCl$_3$, TMS): δ/ppm 6.19+6.05+5.81+5.77 (m+m+m+m, 2H), 2.91+2.85 (m+m, 2H), 2.48 to 2.27 (m, 2H), 1.15 to 1.08 (s+s+m, 12H).

(ii) Synthesis of 3-tert-butyl-1-ethyl-6,6-diphenylfulvene

A 300 ml three neck flask equipped with a magnetic stirrer and a three-way cock was charged with 5.11 g (23.9 mmol) (GC purity: 75%) of 1-ethyl-3-tert-butylcyclopentadiene and 150 ml of THF under nitrogen atmosphere. A 1.56M n-butyl-lithium hexane solution 16 ml (25.2 mmol) was added dropwise thereto on a dry ice/methanol bath, and then the solution was stirred at room temperature for 20 hours. 1,3-Dimethyl-2-imidazolidinone 3.1 ml (28.8 mmol) was added to the reaction solution obtained, and subsequently 5.3 g (28.8 mmol) of benzophenone was added thereto and stirred for 48 hours under refluxing. The reaction solution was poured into 100 ml of 2N hydrochloric acid. The organic layer was separated, and the aqueous layer was extracted twice with 50 ml of hexane. It was combined with the previous organic layer and washed with a saturated sodium hydrogen carbonate aqueous solution, water and a saturated sodium chloride aqueous solution. The organic layer was dried on magnesium sulfate, and then the solvent was removed by distillation. Thereafter, the residue was purified by column chromatography to obtain 4.2 g of an orange solid matter. The yield was 56%. The product was identified by means of a $^1$H-NMR spectrum. The measurement results thereof are shown below.

$^1$H-NMR spectrum (270 MHz, CDCl$_3$, TMS): δ/ppm 7.2 to 7.4 (m, 10H), 6.3 (m, 1H), 5.7 (m, 1H), 1.70+1.85 (q, 2H), 1.15 (s, 9H), 0.85 (t, 3H).

(iii) Synthesis of diphenylmethylene(3-tert-butyl-5-ethylcyclopentadienyl)(2,7-di-tert-butylfluorenyl)

A 200 ml three neck flask equipped with a magnetic stirrer and a three-way cock was sufficiently purged with nitrogen, and 3.8 g of 2,7-di-tert-butylfluorene (13.7 mmol) was dissolved in 80 ml of dehydrated diethyl ether under nitrogen atmosphere. An n-butyllithium/hexane solution (1.56M: 14.3 mmol) 9.2 ml was added dropwise to the above solution on an ice and water bath, and then the solution was stirred at room temperature for 100 hours. Added to this reaction solution was 4.5 g of 3-tert-butyl-1-ethyl-6,6-diphenylfulvene (14.3 mmol), and the solution was stirred for 30 hours under refluxing. The reaction solution was poured into 100 ml of a 2N hydrochloric acid aqueous solution on an ice bath, and then diethyl ether was added thereto. The organic layer was separated, and the aqueous layer was extracted twice with 50 ml of diethyl ether. It was combined with the previous organic layer and washed with a saturated sodium hydrogen carbonate aqueous solution, water and a saturated sodium chloride aqueous solution. The organic layer was dried on magnesium sulfate, and the solvent was removed by distillation. Then, the residue was purified by column chromatography to obtain 4.2 g of a white solid matter. The yield was 53%. The product was identified by means of an FD-mass analysis spectrum (FD-MS). The measurement result thereof is shown below.

FD-MS: m/z=592 (M$^+$).

(iv) Synthesis of diphenylmethylene(3-tert-butyl-5-ethylcyclopentadienyl)(2,7-di-tert-butylfluorenyl) zirconium dichloride A Shlenck flask of 100 ml equipped with a magnetic stirrer chip and a three-way cock was sufficiently purged with nitrogen, and 1.0 g of diphenylmethylene(3-tert-butyl-5-ethylcyclopentadienyl)(2,7-di-tert-butylfluorenyl) (1.68 mmol) was dissolved in 40 ml of dehydrated diethyl ether under nitrogen atmosphere. A 1.56M n-butyllithium/hexane solution 2.2 ml (3.4 mmol) was added dropwise to the above solution on an ice bath, and then the solution was stirred at room temperature for 28 hours. The above solution was sufficiently cooled on a dry ice/methanol bath, and then 0.39 g of zirconium tetrachloride (1.68 mmol) was added thereto. The solution was stirred for 48 hours while allowing the temperature to return slowly to room temperature, and then the solvent was removed by distillation under reduced pressure. The residue was slurried with hexane, and the slurry was filtrated through a glass filter filled with diatomaceous earth. A brown solid matter on the filter was extracted with a small amount of dichloromethane and separated by filtration. The solvents were removed respectively from the hexane solution and the dichloromethane solution each obtained above by distillation under reduced pressure. Dark orange solid matters were washed respectively with a small amount of pentane and diethyl ether and dried under reduced pressure, whereby 140 mg (0.186 mmol) of the targeted compound was obtained in the form of an orange solid matter. The product was identified by means of a $^1$H-NMR spectrum and an FD-mass analysis spectrum (FD-MS). The measurement results thereof are shown below.

$^1$H-NMR spectrum (270 MHz, CDCl$_3$, TMS): δ/ppm 7.90 to 8.07 (m, 5H), 7.75 (m, 1H), 7.15 to 7.60 (m, 8H), 6.93 (m, 1H), 6.15 to 6.25 (m, 2H), 5.6 (d, 1H), 2.05+2.25 (q, 2H), 0.95 to 1.15 (s+t+s, 30H).

FD-MS: m/z=752 (M+).

Syndiotactic Propylene Polymer (AA-1)

Polymerization Example AA-1

(Synthesis of Syndiotactic Propylene Polymer (AA-1))

A glass autoclave having an inner volume of 500 ml which was sufficiently purged with nitrogen was charged with 250 ml of toluene, and propylene was allowed to flow in an amount of 150 liter/hour to maintain it at 25° C. for 20 minutes. On the other hand, a magnetic stirrer was put in a side-arm flask having an inner volume of 30 ml which was sufficiently purged with nitrogen, and 5.00 mmol of a toluene solution (Al=1.53 mol/l) of methylaluminoxane and then 5.0 μmol of a toluene solution of dibenzylmethylene(cyclopentadienyl)(3,6-di-tert-butylfluorenyl)zirconium dichloride were added thereto and stirred for 20 minutes. This solution was added to toluene in the glass autoclave in which propylene had been allowed to flow, and polymerization was initiated. A propylene gas was supplied continuously in an amount of 150 liter/hour to carry out polymerization at an atmospheric pressure and 25° C. for 40 minutes, and then a small amount of methanol was added to terminate the polymerization. The polymer solution was added to large excess methanol to deposit a polymer, and the polymer was dried at 80° C. under reduced pressure for 12 hours to result in obtaining 2.38 g of the polymer. The polymerization activity was 0.63 kg-PP/mmol-Zr·hr, and the polymer obtained had [η] of 1.9 dl/g, Tm1 of 152° C., Tm2 of 158° C. and rrrr of 93.5%. The physical properties thereof are shown in Table 3.

Syndiotactic Propylene Polymer (AA-2)

Syndiotactic polypropylene (trade name: Finaplas 1471, MFR=5.0 g/10 minutes) manufactured by Total Co., Ltd. was used. The physical properties thereof are shown in Table 3.

Syndiotactic propylene polymer (AA-3)

Polymerization Example AA-3

(Synthesis of Syndiotactic Propylene Polymer (AA-3))

A syndiotactic propylene polymer (AA-3) (propylene homopolymer) having the same TMA softening temperature, rrrr fraction and Mw/Mn as those of the polymer (AA-1) described above and having [η] of 1.4 dl/g was obtained according to the production process of Polymerization Example AA-1, except that hydrogen was further supplied to the polymerization system. The physical properties thereof are shown in Table 4.

Syndiotactic propylene polymer (AA-4)

Polymerization Example AA-4

(Synthesis of Syndiotactic Propylene Polymer (AA-4))

A propylene homopolymer having the same TMA softening temperature, rrrr fraction and Mw/Mn as those of the polymer (AA-1) described above and having [η] of 1.2 dl/g was obtained according to the production process of Polymerization Example AA-1, except that hydrogen was further supplied to the polymerization system. The physical properties thereof are shown in Table 4.

Syndiotactic Propylene Polymer (AA-5))

Syndiotactic polypropylene (trade name: Finaplas 1571, MFR=9.1 g/10 minutes) manufactured by Total Co., Ltd. was used. The physical properties thereof are shown in Table 4.

Propylene·α-Olefin Copolymer (BB-1)

Polymerization Example BB-1

(Synthesis of Propylene·α-Olefin Copolymer (BB-1)

A polymerization reactor of 4000 ml which was sufficiently purged with nitrogen was charged with 1834 ml of dried hexane and triisobutylaluminum (1.0 mmol) at ambient temperature. Then, the inside of the polymerization reactor was heated to 70° C., and pressure was applied by propylene so that the inside pressure of the system was 0.66 MPa. Thereafter, the inside pressure of the system was controlled to 1.36 MPa by ethylene. Di(p-chlorophenyl)methylene(cyclopentadienyl)-(octamethyloctahydrodibenzofluorenyl)zirconium dichloride was mixed with a toluene solution of methylaluminoxane (manufactured by Tosoh Finechem Corporation) to prepare a toluene solution containing an aluminum atom and a zirconium atom in a proportion of aluminum atom/zirconium atom=300/1 (mole ratio), and then the above toluene solution was taken in an amount containing 0.001 mmol of [a] zirconium atom (accordingly, an amount containing 0.3 mmol of an aluminum atom) and added to the polymerization reactor. They were polymerized at an inside temperature of 70° C. for 15 minutes while maintaining the inside pressure of the system at 1.36 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 105 g, MFR of 0.7 (g/10 minutes) and [η] of 2.5 (dl/g) which was measured in decalin at 135° C. The physical properties obtained by measuring the polymer obtained above are shown in Table 5. The $rr_1$ value was 78%.

Propylene·α-Olefin Copolymer (BB-2)

Polymerization Example BB-2

(Synthesis of Propylene·α-Olefin Copolymer (BB-2))

A polymerization reactor of 4000 ml which was sufficiently purged with nitrogen was charged with 1834 ml of dried hexane and triisobutylaluminum (1.0 mmol) at ambient temperature. Then, an inside of the polymerization reactor was heated to 70° C., and pressure was applied by propylene so that the inside pressure of the system was 0.64 MPa. Thereafter, the inside pressure of the system was controlled to 1.34 MPa by ethylene. Next, di(p-chlorophenyl)methylene-(cyclopentadienyl)(octamethyloctahydrodibenzofluorenyl)-zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.001 mmol of a zirconium atom was contained (accordingly, an amount in which 0.3 mmol of an aluminum atom was contained) and added to the polymerization reactor.

They were polymerized at an inside temperature of 70° C. for 15 minutes while maintaining the inside pressure of the system at 1.34 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 109 g, MFR of 0.6 (g/10 minutes) and [η] of 2.6 (dl/g) which was measured in decalin at 135° C. The physical properties obtained by measuring the polymer obtained above are shown in Table 4. The $rr_1$ value was 76%.

Propylene•α-Olefin Copolymer (BB-3)

Polymerization Example BB-3

(Synthesis of Propylene•α-Olefin Copolymer (BB-3))

A polymerization reactor of 4000 ml which was sufficiently purged with nitrogen was charged with 1834 ml of dried hexane and triisobutylaluminum (1.0 mmol) at ambient temperature. Then, an inside of the polymerization reactor was heated to 70° C., and pressure was applied by propylene so that the inside pressure of the system was 0.67 MPa. Thereafter, the inside pressure of the system was controlled to 1.37 MPa by ethylene. Next, di(p-chlorophenyl)methylene-(cyclopentadienyl)(octamethyloctahydrodibenzofluorenyl)-zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.001 mmol of a zirconium atom was contained (accordingly, an amount in which 0.3 mmol of an aluminum atom was contained) and added to the polymerization reactor. They were polymerized at an inside temperature of 70° C. for 10 minutes while maintaining the inside pressure of the system at 1.37 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 90 g, MFR of 1.0 (g/10 minutes) and [η] of 2.3 (dl/g) which was measured in decalin at 135° C. The physical properties obtained by measuring the polymer obtained above are shown in Table 4. The $rr_1$ value was 75%.

Propylene•α-Olefin Copolymer (BB-4)

Polymerization Example BB-4

(Synthesis of Propylene•α-Olefin Copolymer (BB-4))

A polymerization reactor of 4000 ml which was sufficiently purged with nitrogen was charged with 1834 ml of dried hexane, 20 g of 1-butene and triisobutylaluminum (1.0 mmol) at ambient temperature. Then, an inside of the polymerization reactor was heated to 70° C., and pressure was applied by propylene so that the inside pressure of the system was 0.63 MPa. Thereafter, the inside pressure of the system was controlled to 1.33 MPa by ethylene. Next, di(p-chlorophenyl)methylene(cyclopentadienyl)-(octamethyloctahydrodibenzofluorenyl)zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.001 mmol of a zirconium atom was contained (accordingly, an amount in which 0.3 mmol of an aluminum atom was contained) and added to the polymerization reactor. They were polymerized at an inside temperature of 70° C. for 10 minutes while maintaining the inside pressure of the system at 1.33 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 102 g, MFR of 1.0 (g/10 minutes) and [η] of 2.3 (dl/g) which was measured in decalin at 135° C. The physical properties obtained by measuring the polymer obtained above are shown in Table 4. The $rr_i$ value was 75%.

Propylene•α-Olefin Copolymer (BB-5))

Polymerization Example BB-5

(Synthesis of Propylene•α-Olefin Copolymer (BB-5))

A polymerization reactor of 2000 ml which was sufficiently purged with nitrogen was charged with 833 ml of dried hexane, 120 g of 1-butene and triisobutylaluminum (1.0 mmol) at ambient temperature. Then, an inside of the polymerization reactor was heated to 60° C., and pressure was applied by propylene so that the inside pressure of the system was 0.33 MPa. Thereafter, the inside pressure of the system was controlled to 0.62 MPa by ethylene. Next, dip-chlorophenyl)methylene(cyclopentadienyl)-(octamethyloctahydrodibenzofluorenyl)zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.002 mmol of a zirconium atom was contained (accordingly, an amount in which 0.6 mmol of an aluminum atom was contained) and added to the polymerization reactor. They were polymerized at an inside temperature of 60° C. for 20 minutes while maintaining the inside pressure of the system at 0.62 MPa by ethylene, and 20 ml of methanol was added to terminate the polymerization. After releasing the pressure, the polymer was deposited from the polymerization solution in 2 L of methanol, and the polymer was dried at 130° C. for 12 hours under vacuum. The polymer thus obtained had a weight of 73 g and [η] of 2.1 (dl/g) which was measured in decalin at 135° C. The physical properties obtained by measuring the polymer obtained above are shown in Table 3.

Propylene•α-Olefin Copolymer (BB-6))

Polymerization Example BB-6

(Synthesis of Propylene•α-Olefin Copolymer (BB-6))

A polymerization reactor of 2000 ml which was sufficiently purged with nitrogen was charged with 833 ml of dried hexane, 120 g of 1-butene and triisobutylaluminum (1.0 mmol) at ambient temperature. Then, an inside of the polymerization vessel was heated to 60° C., and pressure was applied by propylene so that the inside pressure of the system was 0.33 MPa. Thereafter, the inside pressure of the system was controlled to 0.63 MPa by ethylene. Next, di(p-chlorophenyl)methylene(cyclopentadienyl)-(octamethyloctahydrodibenzofluorenyl)zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.002 mmol of a zirconium atom was contained (accordingly, an amount in which 0.6 mmol of an aluminum atom was contained) and added to the polymerization reactor. They were polymerized at an inside temperature of 60° C. for 20 minutes while maintaining the inside pressure of the system at 0.63 MPa by ethylene, and 20 ml of methanol was added to terminate the polymerization. After releasing the pressure, the polymer was deposited from the polymerization solution in 2 L of methanol, and the polymer was dried at 130° C. for 12 hours under vacuum. The polymer thus obtained had a weight of 97 g and [η] of 2.3 (dl/g) which was measured in decalin at 135° C. The physical properties obtained by measuring the polymer obtained above are shown in Table 3.

Propylene•α-Olefin Copolymer (BB-7))

Polymerization Example BB-7

(Synthesis of Propylene•α-Olefin Copolymer (BB-7))

A polymerization reactor of 4000 ml which was sufficiently purged with nitrogen was charged with 1834 ml of dried hexane and triisobutylaluminum (1.0 mmol) at ambient temperature. Then, an inside of the polymerization reactor was heated to 70° C., and pressure was applied by propylene so that the inside pressure of the system was 0.67 MPa. Thereafter, the inside pressure of the system was controlled to 1.37 MPa by ethylene. Next, di(p-chlorophenyl)methylene(cyclopentadienyl)(octamethyloctahydrodibenzofluorenyl)zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.001 mmol of a zirconium atom was contained (accordingly, an amount in which 0.3 mmol of an aluminum atom was contained) and added to the polymerization reactor. They were polymerized at an inside temperature of 70° C. for 10 minutes while maintaining the inside pressure of the system at 1.37 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 90 g and [η] of 2.2 (dl/g) which was measured in decalin at 135° C. The physical properties obtained by measuring the polymer obtained above are shown in Table 3.

Propylene•α-Olefin Copolymer (BB-8)

Polymerization Example BB-8

(Synthesis of Propylene•α-Olefin Copolymer (BB-8))

A polymerization reactor of 4000 ml which was sufficiently purged with nitrogen was charged with 1834 ml of dried hexane and triisobutylaluminum (1.0 mmol) at ambient temperature. Then, an inside of the polymerization reactor was heated to 50° C., and pressure was applied by propylene so that the inside pressure of the system was 0.67 MPa. Thereafter, the inside pressure of the system was controlled to 1.37 MPa by ethylene. Next, di(p-chlorophenyl)methylene(cyclopentadienyl)(octamethyloctahydrodibenzofluorenyl)zirconium dichloride was mixed with a toluene solution of methylaluminoxane (manufactured by Tosoh Finechem Corporation) to prepare a toluene solution in which an aluminum atom and a zirconium atom were contained in a proportion of aluminum atom/zirconium atom=300/1 (mole ratio), and then the above toluene solution was taken in an amount in which 0.001 mmol of a zirconium atom was contained (accordingly, an amount in which 0.3 mmol of an aluminum atom was contained) and added to the polymerization reactor. They were polymerized at an inside temperature of 50° C. for 10 minutes while maintaining the inside pressure of the system at 1.37 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 78 g, [η] of 3.5 (dl/g) which was measured in decalin at 135° C. and an ethylene content of 18 mol % which was measured by $^1$H-NMR spectrum. The physical properties obtained by measuring the polymer obtained above are shown in Table 4.

Propylene Polymer (DD-1)

PP (trade name: F102W, MFR=2.1 g/10 minutes) manufactured by Prime Polymer Co., Ltd. was used.

Propylene Polymer (DD-2)

PP (trade name: J104W, MFR=5.2 g/10 minutes) manufactured by Prime Polymer Co., Ltd. was used.

Propylene polymer (DD-3)

PP (trade name: B101, MFR=0.7 g/10 minutes) manufactured by Prime Polymer Co., Ltd. was used.

Propylene polymer (DD-4)

PP (trade name: J106G, MFR=15.0 g/10 minutes) manufactured by Prime Polymer Co., Ltd. was used.

Propylene polymer (DD-5)

PP (trade name: J107G, MFR=30.0 g/10 minutes) manufactured by Prime Polymer Co., Ltd. was used.

Propylene polymer (DD-6)

PP (trade name: J108M, MFR=45.0 g/10 minutes) manufactured by Prime Polymer Co., Ltd. was used.

Propylene polymer (DD-7)

(Synthesis of Propylene•Ethylene•Butene Copolymer)

A polymerization reactor of 4000 ml which was sufficiently purged with nitrogen was charged with 1834 ml of dried hexane, 110 g of 1-butene and triisobutylaluminum (1.0 mmol) at ambient temperature. Then, an inside of the polymerization reactor was heated to 55° C., and pressure was applied by propylene so that the inside pressure of the system was 0.58 MPa. Thereafter, the inside pressure of the system was controlled to 0.75 MPa by ethylene. Next, diphenylmethylene(3-tert-butyl-5-ethylcyclopentadienyl)(2,7-di-tert-butylfluorenyl)zirconium dichloride synthesized in Catalyst Synthetic Example 4 was mixed with a toluene solution of methylaluminoxane (manufactured by Tosoh Finechem Corporation) to prepare a toluene solution containing an aluminum atom and a zirconium atom in a proportion of aluminum atom/zirconium atom=300/1 (mole ratio), and then the above toluene solution was taken in an amount containing 0.001 mmol of a zirconium atom (accordingly, an amount containing 0.3 mmol of an aluminum atom) and added to the polymerization reactor. They were polymerized at an inside temperature of 55° C. for 25 minutes while maintaining the inside pressure of the system at 0.75 MPa by ethylene, and 20 ml of methanol was added to terminate the polymerization. After releasing the pressure, the polymer was deposited from the polymerization solution in 4 L of methanol, and the polymer was dried at 130° C. for 12 hours under vacuum. The polymer thus obtained had a weight of 120.2 g and MFR of 0.7 (g/10 minutes). The physical properties obtained by measuring the polymer obtained above are shown in Table 6.

Propylene polymer (DD-8)

Used was a polymer which was produced according to the production conditions of the propylene polymer (DD-7) described above, except that the polymerization temperature was changed to 40° C. and which had the same ethylene content and butene content as those of the propylene polymer (DD-7) and had [η] of 4.0 and Mw/Mn of 2.1.

The physical properties of the propylene polymers (DD-1) to (DD-8) described above are shown in Table 6.

TABLE 3

| | | | Syndiotactic propylene polymer (AA) | | Propylene•α-olefin copolymer (BB) | | |
|---|---|---|---|---|---|---|---|
| | | | (AA-1) | (AA-2) | (BB-5) | (BB-6) | (BB-7) |
| Composition | (a) Propylene content | (mole %) | 100 | 100 | 66 | 62 | 82 |
| | (b) Ethylene content | (mole %) | 0 | 0 | 5 | 10 | 18 |
| | (c) α-olefin content | (mole %) | 0 | 0 | 29 | 28 | 0 |
| Melting point (Tm) | | (° C.) | 152/158 | 113/125 | — | — | — |
| rrrr | | (%) | 94 | 69 | — | — | — |
| [η] | | | 1.9 | 1.6 | 2.1 | 2.3 | 2.2 |
| MFR | | (g/10 minutes) | 2.4 | 5.0 | 1.2 | 0.9 | 1.1 |
| Density | | (g/cm$^3$) | 0.882 | 0.877 | 0.870 | 0.858 | 0.852 |
| ΔH | | (mJ/mg) | 62 | 33 | — | — | — |
| Tg | | (° C.) | −5.7 | −6.5 | −15.2 | −23.7 | −26.8 |
| Mw/Mn | | | 2.0 | 2.0 | 2.0 | 2.0 | 2.0 |
| $t_{1/2}$ (110° C.) | | (sec) | 138 | 22730 | | | |
| Amount of decane soluble part | | (%) | <0.5 | 25 | | | |

TABLE 4

| | | Syndiotactic propylene polymer (A) | | | Propylene•α-olefin copolymer (B) |
|---|---|---|---|---|---|
| | | (AA-3) | (AA-4) | (AA-5) | (BB-8) |
| rr | (%) | — | — | — | 75 |
| MFR | (g/10 minutes) | 16.8 | 20.3 | 9.1 | 0.1 |
| [η] | (dL/g) | 1.4 | 1.2 | 1.3 | 3.5 |

TABLE 5

| | | | Propylene•α-olefin copolymer | | | |
|---|---|---|---|---|---|---|
| | | | (BB-1) | (BB-2) | (BB-3) | (BB-4) |
| Composition | (a) Propylene content | (mole %) | 77 | 72 | 82 | 68 |
| | (b) Ethylene content | (mole %) | 23 | 28 | 18 | 27 |
| | (c) α-olefin content | (mole %) | 0 | 0 | 0 | 5 |
| Melting point (Tm) | | (° C.) | — | — | — | — |
| rrrr | | (%) | — | — | — | — |
| rr | | (%) | 82.9 | 84.6 | 83.5 | 82.1 |
| MFR | | (g/10 minutes) | 0.7 | 0.6 | 1.0 | 1.0 |
| [η] | | (dL/g) | 2.5 | 2.6 | 2.3 | 2.3 |
| Density | | (g/cm$^3$) | 0.852 | 0.852 | 0.852 | 0.853 |
| ΔH | | (mJ/mg) | — | — | — | — |
| Tg | | (° C.) | −30.1 | −34.9 | −26.8 | −35.4 |
| Mw/Mn | | | 2.0 | 2.0 | 2.0 | 2.0 |

TABLE 6

| | | Propylene polymer (D) | | | | | | | |
|---|---|---|---|---|---|---|---|---|---|
| | | (DD-1) | (DD-2) | (DD-3) | (DD-4) | (DD-5) | (DD-6) | (DD-7) | (DD-8) |
| MFR | (g/10 minutes) | 2.1 | 5.2 | 0.7 | 15.0 | 30.0 | 45.0 | 0.7 | 0.2 |
| [η] | (dL/g) | 2.7 | 2.4 | 3.2 | 1.9 | 1.7 | 1.4 | 2.9 | 4.0 |
| mmmm | (%) | — | — | — | 96 | — | 96 | — | — |

INDUSTRIAL APPLICABILITY

The sheet of the present invention for sealing a solar cell has an excellent heat resistance even if not cross-linked. Use of the sheet of the present invention for sealing a solar cell makes it possible to obtain a sheet for sealing a solar cell which does not generate a decomposition gas exerting an adverse effect on a solar cell and which is excellent in heat resistance, flexibility, solar cell sealing property (making thermal lamination possible in a broad temperature range), mechanical strength and transparency even if the above composition is not cross-linked.

The invention claimed is:

1. A thermoplastic resin composition for sealing a solar cell comprising:
   (A) 10 to 50 parts by weight of a propylene-based polymer satisfying the following requisite (a) and
   (B) 50 to 90 parts by weight of a propylene-based copolymer satisfying the following requisite (b) (provided that a total amount of (A) and (B) is 100 parts by weight);
   (a): a melting point observed in differential scanning calorimetry is 100° C. or higher,
   (b): MFR measured at 230° C. and a load of 2.16 kg according to ASTM D-1238 falls in a range of 0.01 to 100 g/10 minutes, and at least one of the following requisites (b-1) and (b-2) is satisfied;
   (b-1): a syndiotactic triad fraction (rr fraction) measured by a $^{13}$C-NMR method is 60% or more and
   (b-2): a structural unit derived from propylene is contained in an amount of 55 to 90 mole %, and a structural unit derived from at least one olefin selected from α-olefins having 2 to 20 carbon atoms (excluding propylene) is contained in an amount of 10 to 45 mole % (provided that the total of the structural unit derived from propylene and the structural unit derived from at least one olefin selected from α-olefins having 2 to 20 carbon atoms (excluding propylene) is 100 mole %); and an intrinsic viscosity [η] (dL/g) measured in decalin at 135° C. and MFR (g/10 minutes, 230° C., load: 2.16 kg) described above satisfy a relational equation:

$$1.50 \times MFR^{(-0.20)} \leq [\eta] \leq 2.65 \times MFR^{(-0.20)} \text{ and}$$

0.01 to 10 parts by weight of a coupling agent (X) based on total 100 parts by weight of the propylene-based polymer (A) and the propylene-based copolymer (B).

2. The thermoplastic resin composition for sealing a solar cell as described in claim 1, wherein the propylene-based polymer (A) is an isotactic propylene-based polymer (A-1).

3. The thermoplastic resin composition for sealing a solar cell as described in claim 1, wherein the propylene-based polymer (A) is a syndiotactic propylene-based polymer (A-2).

4. A thermoplastic resin composition for sealing a solar cell obtained by subjecting (A) 10 to 50 parts by weight of a propylene-based polymer satisfying the following requisite (a), (B) 50 to 90 parts by weight of a propylene-based copolymer satisfying the following requisite (b) (provided that a total amount of (A) and (B) is 100 parts by weight) and a coupling agent (X) to heat treatment under the presence of organic peroxide;
   (a): a melting point observed in differential scanning calorimetry is 100° C. or higher,
   (b): MFR measured at 230° C. and a load of 2.16 kg according to ASTM D-1238 falls in a range of 0.01 to 100 g/10 minutes, and at least one of the following requisites (b-1) and (b-2) is satisfied;
   (b-1): a syndiotactic triad fraction (rr fraction) measured by a $^{13}$C-NMR method is 60% or more and
   (b-2): a structural unit derived from propylene is contained in an amount of 55 to 90 mole %, and a structural unit derived from at least one olefin selected from α-olefins having 2 to 20 carbon atoms (excluding propylene) is contained in an amount of 10 to 45 mole % (provided that the total of the structural unit derived from propylene and the structural unit derived from at least one olefin selected from α-olefins having 2 to 20 carbon atoms (excluding propylene) is 100 mole %); and an intrinsic viscosity [α](dL/g) measured in decalin at 135° C. and MFR (g/10 minutes, 230° C., load: 2.16 kg) described above satisfy a relational equation:

$$1.50 \times MFR^{(-0.20)} \leq [\eta] \leq 2.65 \times MFR^{(-0.20)}$$

5. A sheet for sealing a solar cell formed from the thermoplastic resin composition for sealing a solar cell as described in claim 1.

6. The sheet for sealing a solar cell as described in claim 5, wherein the thermoplastic resin composition for sealing a solar cell is not cross-linked.

7. A sheet for sealing a solar cell formed from the thermoplastic resin composition for sealing a solar cell as described in claim 5.

* * * * *